(12) United States Patent  (10) Patent No.: US 8,427,881 B2
Jang et al.  (45) Date of Patent: Apr. 23, 2013

(54) SEMICONDUCTOR MEMORY DEVICE AND PROGRAMMING METHOD THEREOF

(75) Inventors: Jae Hoon Jang, Seongnam-si (KR); Jung Dal Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 392 days.

(21) Appl. No.: 12/748,613

(22) Filed: Mar. 29, 2010

(65) Prior Publication Data

US 2011/0019486 A1  Jan. 27, 2011

(30) Foreign Application Priority Data

Jul. 22, 2009  (KR) .................................. 2009-66933

(51) Int. Cl.
*G11C 11/4094* (2006.01)
(52) U.S. Cl.
USPC .................. 365/185.25; 365/185.02; 365/195
(58) Field of Classification Search ............. 365/185.11, 365/185.13, 185.17, 185.25, 203, 195, 185.02
See application file for complete search history.

(56) References Cited

U.S. PATENT DOCUMENTS

| | | | | |
|---|---|---|---|---|
| 7,639,529 B2* | 12/2009 | Park et al. | ................ | 365/185.03 |
| 2005/0122779 A1* | 6/2005 | Fasoli et al. | .............. | 365/185.17 |
| 2006/0146608 A1* | 7/2006 | Fasoli et al. | .............. | 365/185.17 |
| 2007/0206416 A1* | 9/2007 | Hazama et al. | .......... | 365/185.05 |
| 2007/0252201 A1 | 11/2007 | Kito et al. | | |
| 2009/0168482 A1* | 7/2009 | Park et al. | ........................ | 365/51 |
| 2009/0168533 A1* | 7/2009 | Park et al. | ................ | 365/185.17 |
| 2009/0251962 A1* | 10/2009 | Yun et al. | ................ | 365/185.02 |
| 2010/0091576 A1* | 4/2010 | Kwon et al. | ............. | 365/185.25 |

FOREIGN PATENT DOCUMENTS

| | | |
|---|---|---|
| KR | 100673019 | 1/2007 |
| KR | 2008-12667 | 2/2008 |
| KR | 2008-96734 | 11/2008 |

\* cited by examiner

*Primary Examiner* — Douglas King
(74) *Attorney, Agent, or Firm* — Stanzione & Kim, LLP

(57) ABSTRACT

A programming method of a semiconductor memory device includes charging a channel of an inhibit string to a precharge voltage provided to the common source line and boosting the charged channel by providing a wordline voltage to the cell strings. The inhibit string is connected to a program bitline among the bitlines.

7 Claims, 18 Drawing Sheets

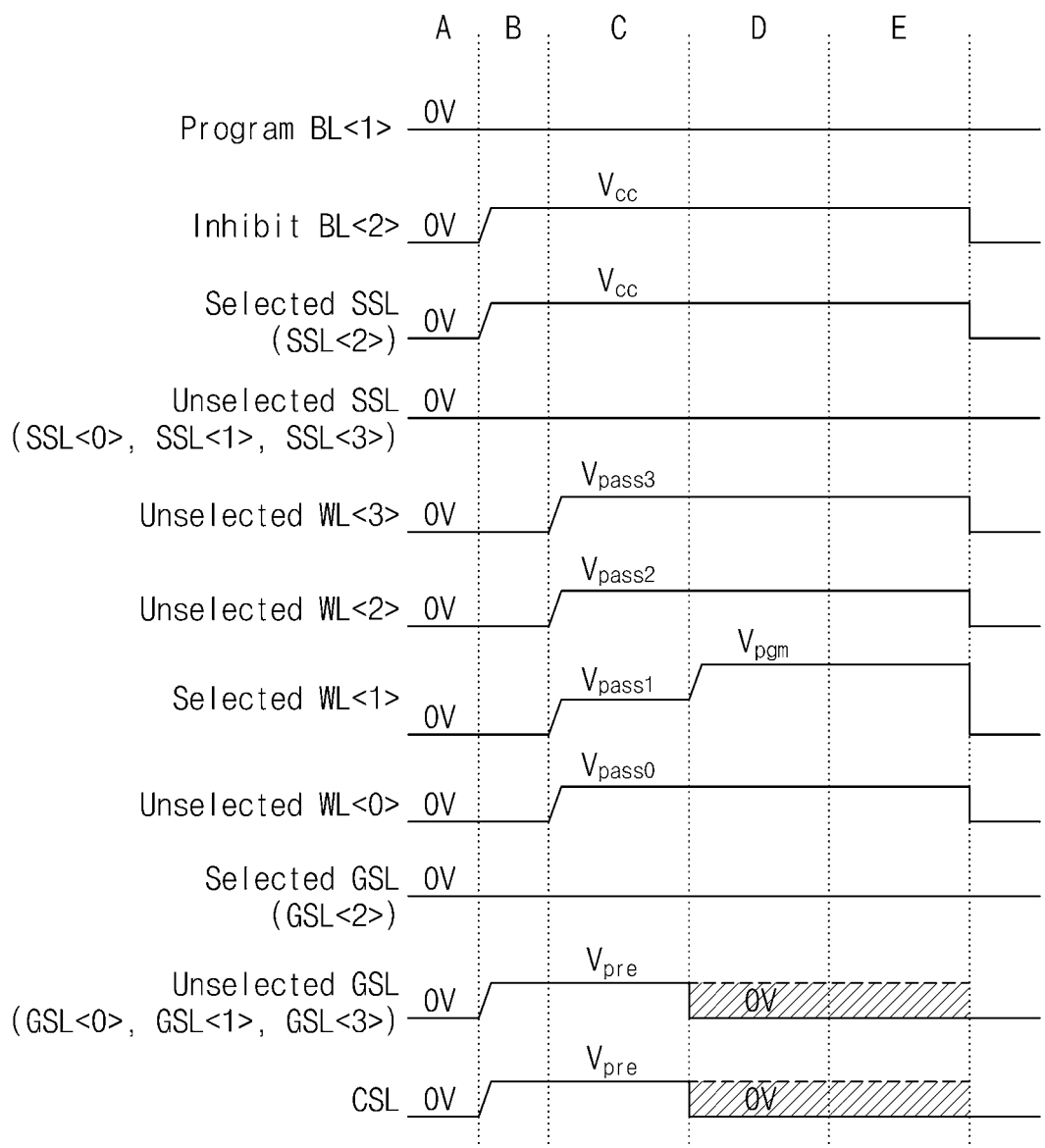

SEMICONDUCTOR MEMORY DEVICE AND PROGRAMMING METHOD THEREOF

CROSS-REFERENCE TO RELATED APPLICATIONS

This application claims priority under 35 U.S.C. §119 to Korean Patent Application No. 2009-0066933 filed on Jul. 22, 2009 in the Korean Intellectual Property Office (KIPO), the contents of which are herein incorporated by reference in their entirety.

BACKGROUND

1. Field of the Invention

The present invention relates to semiconductor memory devices and, more specifically, to a three-dimensional semiconductor memory device and a programming method thereof.

2. Description of the Related Art

In order to meet ever-increasing needs of the users for superior performance and low costs, there is a requirement for high integration density of semiconductor memory devices. Since integration density of semiconductor memory devices is significant in determining the price of products, there is a requirement for increased integration density. In case of conventional two-dimensional semiconductor memory devices, their integration density is mainly determined by an area occupied by a unit memory cell. Therefore, the conventional two-dimensional semiconductor memory devices are greatly affected by fine-pattern forming technologies. However, because extremely high-priced apparatuses are needed to achieve fine patterns, the integration density of two-dimensional semiconductor memory devices is still limited.

SUMMARY

Embodiments of the present general inventive concept provide three-dimensional semiconductor memory devices including memory cells arranged three-dimensionally. Embodiments of the present general inventive concept also provide methods of fabrication such that the cost per bit of three-dimensional semiconductor memory devices according to exemplary embodiments of the present inventive concept are lower than that of two-dimensional semiconductor memory devices. Exemplary embodiments of the present general inventive concept also provide control methods to control three-dimensionally arranged memory cell. Exemplary embodiments of the present general inventive concept provide methods and apparatus to control complex lines during a program operation of a three-dimensional semiconductor memory device to obtain highly reliable products.

Embodiments of the present general inventive concept provide a programming method of a semiconductor memory device including a plurality of cell strings coupled between a common source line and a plurality of bitlines. In exemplary embodiments, the programming method may include charging a channel of an inhibit string to a precharge voltage provided to the common source line and boosting the charged channel by providing a wordline voltage to the cell strings. The inhibit string is connected to a program bitline among the plurality of bitlines.

Embodiments of the present general inventive concept provide a semiconductor memory device. In exemplary embodiments, the semiconductor memory device may include a plurality of bitlines and a plurality of cell strings disposed between a common source line and the bitlines. Each of the cell strings includes an upper selection structure including a plurality of string selection transistors, a memory structure including a plurality of cell transistors, and a lower selection structure including a plurality of ground selection transistors configured to control connection to the common source line. Among the cell strings, a channel of an inhibit string is charged to a precharge voltage provided to the common source line or charged to a voltage provided to the bitline during a program operation.

Exemplary embodiments of the present general inventive concept provide a method of pre-charging channels of a semiconductor memory device having a first cell group having a first inhibit string connected to a program bitline, a second cell group having a second inhibit string connected to an inhibit bitline, and a common source line connected to the first inhibit string and the second inhibit string, the method including pre-charging a channel of the first inhibit string that is connected to the program bitline by applying a first voltage to the common source line, and pre-charging a channel of the second inhibit string that connected to the inhibit bitline by applying a second voltage to the common source line.

The method may further include applying a first string selection voltage to a select a program string in the first cell group in a program operation.

The method may further include applying a program voltage to a selected wordline of the first cell group, and applying a pass voltage to one or more unselected wordlines of the first cell group.

The method may further include applying a voltage to the inhibit bitline in the program operation where a program voltage and a power supply voltage are applied to the program bitline.

Exemplary embodiments of the present general inventive concept provide a method of pre-charging channels of a semiconductor memory device having a first cell group having a first inhibit string connected to a program bitline, a second cell string group having a second inhibit string connected to an inhibit bitline, and a common source line connected to the first inhibit string and the second inhibit string, the method comprising pre-charging a channel of the first inhibit string that is connected to the program bitline by applying a first voltage to the common source line, and pre-charging a channel of the second inhibit string that connected to the inhibit bitline by applying a second voltage to the inhibit bitline.

The method may further include applying a first string selection voltage to a select a program string in the first cell group in a program operation.

The method may further include applying a program voltage to a selected wordline of the first cell group, and applying a pass voltage to one or more unselected wordlines of the first cell group.

The method may further include applying a voltage to the inhibit bitline in the program operation where a program voltage and a power supply voltage are applied to the program bitline.

Exemplary embodiments of the present general inventive concept provide a method of pre-charging channels of a semiconductor memory device having a first cell group having a program string connected to a program bitline, a second cell string group having an inhibit string connected to an inhibit bitline, the method including pre-charging a channel of the inhibit string that is connected to the inhibit bitline by applying a voltage to a common source line, where the program string is not connected to the inhibit string with the same selection line.

The method may further include applying a first string selection voltage to a select a program string in the first cell group in a program operation.

The method may further include applying a program voltage to a selected wordline of the first cell group, and applying a pass voltage to one or more unselected wordlines of the first cell group.

The method of claim 9, applying a voltage to the inhibit bitline in the program operation where a program voltage and a power supply voltage are applied to the program bitline.

Exemplary embodiments of the present general inventive concept provide a method of pre-charging channels of a semiconductor memory device having a cell string group including a first inhibit string and a second inhibit string connected to an inhibit bitline, and a common source line connected to the first inhibit string and the second inhibit string, the method including pre-charging a channel of the first inhibit string that is that connected to the inhibit bitline by applying a voltage to the common source line, and pre-charging a channel of the second inhibit string that is connected to the inhibit bitline by applying a voltage to the inhibit bitline, wherein the second inhibit string is connected to a program string with a same selection line.

The method may further include applying a first string selection voltage to a select a program string in the first cell group in a program operation.

The method may further include applying a program voltage to a selected wordline of the first cell group, and applying a pass voltage to one or more unselected wordlines of the first cell group.

The method may further include applying a voltage to the inhibit bitline in the program operation where a program voltage and a power supply voltage are applied to the program bitline.

Exemplary embodiments of the present general inventive concept provide a method of pre-charging channels of a semiconductor memory device having a first cell group having a first inhibit string connected to a program bitline, a second cell string group having a second inhibit string connected to an inhibit bitline, a string selection line and a ground selection line, each to connect the first inhibit string and the second inhibit string, and a common source line that the first inhibit string and second inhibit string are connected to, the method including applying a first voltage to the program bitline and a second voltage to the inhibit bitline, applying a first string selection voltage to a select a program string in the first cell group, and before applying a voltage to one or more word lines of the first inhibit string or the second inhibit string, applying a first precharge voltage via the common source line to the first inhibit string and the second inhibit string, and applying a second precharge voltage via the ground selection line.

The method may further include applying a program voltage to a selected wordline of the first cell group, and applying a pass voltage to one or more unselected wordlines of the first cell group.

The method may further include where applying the first string selection voltage includes applying a first block voltage to block selection of the one or more unselected program strings in the first cell group.

The method may further include applying a second string selection voltage to select a string selection line of line of the second cell group, and applying a second block voltage to block selection of the one or more unselected program strings in the first cell group.

BRIEF DESCRIPTION OF THE DRAWINGS

The present general inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating exemplary embodiments of the present general inventive concept.

FIGS. 8A, 8B, and 8C are timing diagrams illustrating a programming method according to exemplary embodiments of the present general inventive concept.

DETAILED DESCRIPTION OF THE EMBODIMENTS

The present general inventive concept will now be described more fully hereinafter with reference to the accompanying drawings, in which exemplary embodiments of the present general inventive concept are illustrated. The present general inventive concept, however, may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

In the specification, the dimensions of layers and regions are exaggerated for clarity of illustration. It will also be understood that when a layer (or film) is referred to as being "on" another layer or substrate, it can be directly on the other layer or substrate, or intervening layers may also be present. Also, though terms like a first, a second, and a third are used to describe various regions and layers in exemplary embodiments of the present general inventive concept, the regions and the layers are not limited to these terms. These terms are used only to reference and/or identify one region or layer from another region or layer. Therefore, a layer referred to as a first layer in one embodiment can be referred to as a second layer in another embodiment. An embodiment described and exemplified herein includes a complementary embodiment thereof.

A NAND-type flash memory device may be one example to illustrate the characteristics and functions of the present general inventive concept. However, those skilled in the art can easily understand other advantages and performances of the present general inventive concept according to the descriptions. The present general inventive concept may be embodied or applied through one or more embodiments. Throughout the specification, it will be explained that terms of "charge" and "precharge" have the same meaning.

Figure 1:
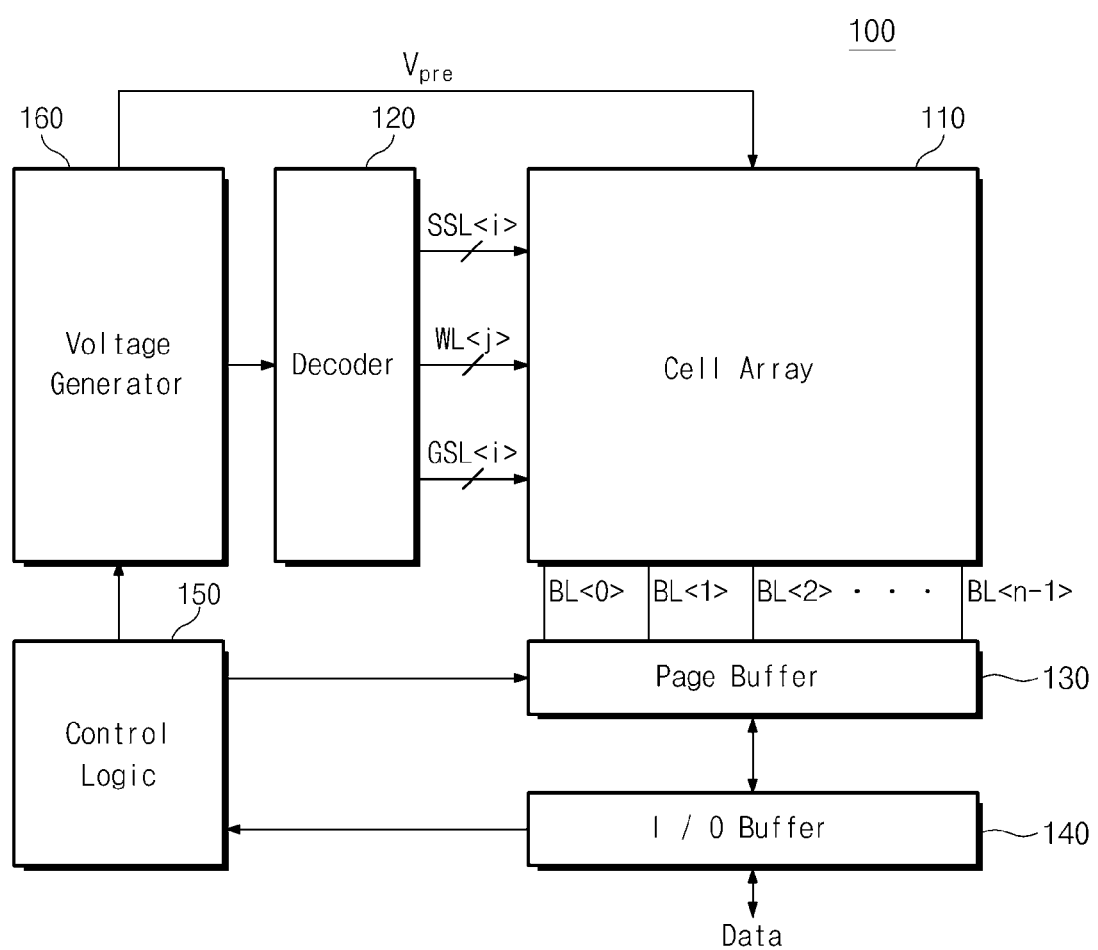
FIG. 1 is a block diagram illustrating a three-dimensional semiconductor memory device according to some embodiments of the present invention.

FIG. 1 is a block diagram illustrating a semiconductor memory device 100 according to exemplary embodiments of the present general inventive concept. The semiconductor memory device 100 includes a cell array 110 in which memory cells are three-dimensionally arranged. The semiconductor memory device 100 further includes a decoder 120 configured to write/read data to/from the cell array 110, a page buffer 130, an input/output buffer (I/O buffer) 140, a control logic 150, and a voltage generator 160.

The cell array 110 includes a plurality of NAND cell strings. One or more of the NAND cell strings may form a channel in a vertical or horizontal direction. In FIG. 1, vertical cell strings each forming a channel in a vertical direction are illustrated. A plurality of wordlines may be vertically stacked at the cell array 110. Each of the wordlines may have a control gate of memory cells included in a cell string. In this case, a channel of a memory cell may be formed in a vertical direction (e.g., in parallel with a cell string CSTR).

According to the arrangement of the cell string 110, each of cell strings sharing one bitline may be individually selected. Each of the individually selected cell strings is connected to a plurality of ground selection lines (GSL) which are electrically isolated from each other. Thus, channels of the respective cell strings sharing one bitline may be selectively precharged by way of the control of the ground selection lines GSL. For example, a plurality of cell strings are connected to a bitline to which a voltage of 0 volts is applied to perform a program operation (hereinafter, the bitline being referred to as "program bitline"). However, there may be a string which is inhibited from programming among cell strings connected to the program bitline (hereinafter, the string being referred to as "inhibit string"). A channel voltage of the inhibit string may be boosted when a program voltage Vpgm is applied to a wordline. If a channel of the inhibit string is sufficiently charged through a common source line CSL before a program operation, a boosting efficiency of the channel may be increased.

The decoder 120 decodes an address (not illustrated) to select one of the wordlines of the cell array 110. The decoder 120 transfers a wordlines voltage $V_{WL}$ provided from the voltage generator 160 to the selected wordline of the cell array 110. For example, the decoder 120 provides a program voltage Vpgm and a pass voltage Vpass to a selected wordline and an unselected wordline in a program operation mode, respectively. The decoder 120 provides a selection voltage to selected lines SSL<i> and GSL<i> (i being a positive integer). A cell selected at a selected layer of the cell array 110 may be accessed by the selection voltage provided to the selection lines SSL<i> and GSL<i>.

During the program operation, there may be strings where one or more channels may have difficulty in being precharged to a voltage provided through a bitline among the inhibit strings. In this case, the decoder 120 may control a ground selection line GSL<i> to provide a precharge voltage Vpre provided from the common source line CSL to the channel of the inhibit string. A channel voltage of the inhibit string is boosted by the precharge Vpre. When the channel voltage of the inhibit string reaches a predetermined level, the channel may be electrically isolated by the configuration of the cell string, i.e., the channel may reach a floating state.

The page buffer 130 may be a write driver or a sense amplifier, according to the operation mode. During the program operation, the page buffer 130 transfers a voltage corresponding to data to be programmed to a bitline of the cell array 110 where cell strings are vertically formed. During a read operation, the page buffer 130 senses data stored in a selected memory cell through a bitline and transfers the sensed data to the I/O buffer 140.

The I/O buffer 140 transfers received data to the page buffer 130 or outputs data provided from the page buffer 130 to the exterior. The I/O buffer 140 transfers an input address or command to the control logic 150 or the decoder 120.

The control logic 150 performs a control operation to execute program, read, and erase operation modes in response to the command transferred from the I/O buffer 140. During the program operation, the control logic 150 controls the voltage generator 160 to generate a precharge voltage Vpre for charging the channel of the inhibit string to the common source line CSL of the cell array 110. According to the operation mode, the control logic 150 controls the page buffer 130 to write or sense data through bitlines BL<0>~<BL<n−1>.

The voltage generator 160 generates one or more kinds of wordline voltages to be respectively provided to wordlines, as well as a voltage provided to a bulk (e.g., well region) where memory cells are formed, according to the control of the control logic 150. The wordline voltages to be respectively provided to the wordlines are a program voltage Vpgm, a pass voltage Vpass, a read voltage Vread and any other suitable voltage to carry out the operations of the present general inventive concept. During the program operation, the voltage generator 160 generates a precharge voltage Vpre to charge the channel of the inhibit string. The voltage generator 160 generates a voltage to be provided to a string selection line SSL<i> and a ground selection line GSL<i>. The selection voltage provided to the ground selection line GSL<i> and the precharge voltage Vpre provided to the common source line CSL may be defined within a level which may be sufficient to effectively float the channel of the inhibit string.

Figure 2:
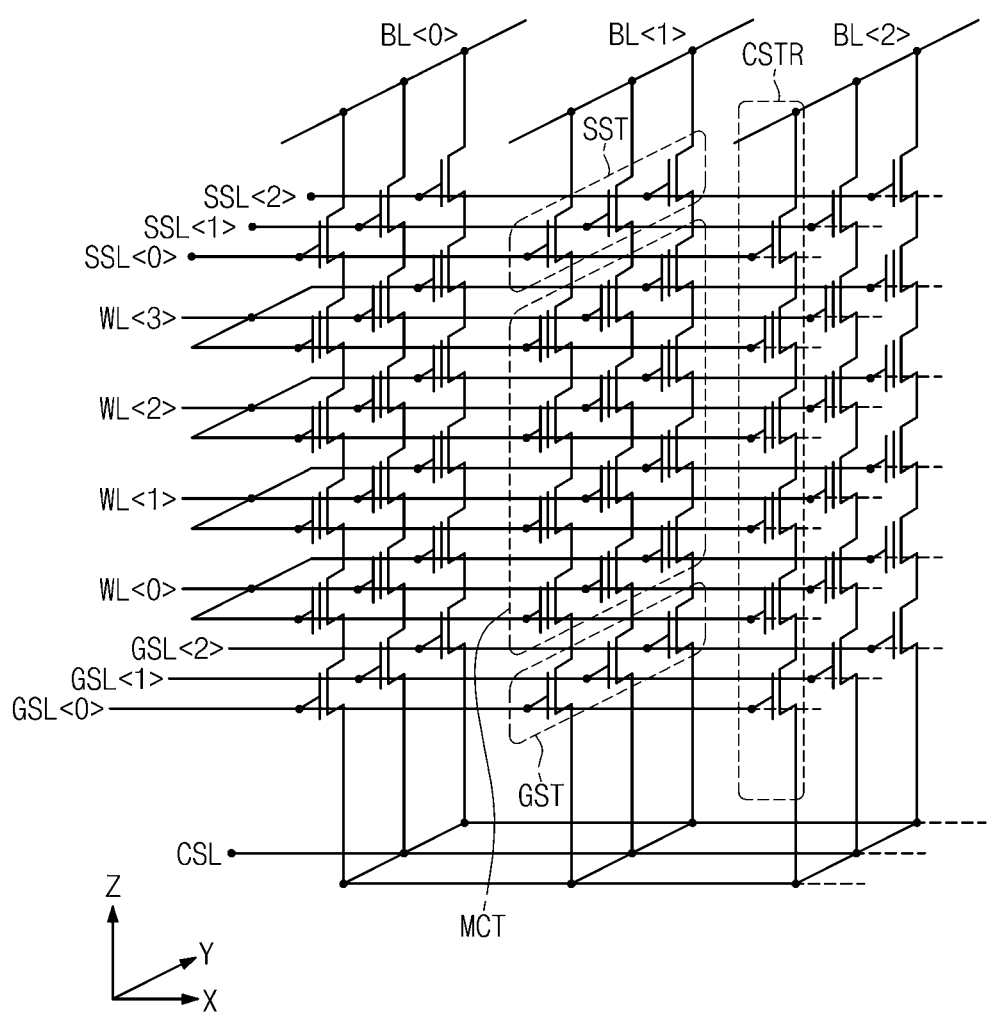
FIG. 2 illustrates a circuit diagram of a cell array illustrated in FIG. 1.

FIG. 2 is a circuit diagram of the cell array 110 illustrated in FIG. 1. The cell array 110 includes a plurality of bitlines BL<0>~BL<2> formed in the Y-axis direction. A common source line CSL is formed on an XY plane. A plurality of cell strings CSTR are formed between the bitlines BL<0>~BL<2> and the common source line CSL in the Z-axis direction.

Features of the cell array 110 will now be described through the explanation of cell strings connected to one bitline BL<1>. Each of the cell strings CSTR connected to the bitline BL<1> includes a string selection transistor SST. The cell strings are electrically connected to and/or insulated to and/or from the bitline BL<1> by the string selection transistor SST. Each of the cell string CSTR connected to the bitline BL<1> includes a ground selection transistor GST. The cell string CSTR is electrically connected to and/or insulated to and/or from the common source line CSL by the ground selection transistor. Memory cell transistors MCT are serially coupled between the string selection transistor SST and the ground selection transistor GST in the Z-axis direction.

In the cell array 110, a wordline WL<3> is commonly connected to memory cell transistors included in one layer. Wordlines WL<0>~WL<2> are commonly connected to memory cell transistors of a corresponding layer, respectively. Accordingly, the memory cell transistors included in the only layer receive an equivalent wordline voltage. During the program operation, a selected one of the wordlines WL<0>~WL<3> may be provided with a program voltage Vpgm, while the other wordlines may be provided with a pass voltage Vpass. The memory cells of the layer corresponding to the selected wordline receive the program voltage Vpgm.

String selection transistors SST formed at one layer are connected to a plurality of selection lines SSL<0>~SSL<2>. A plurality of cell strings are connected to a program bitline BL<1> provided with a voltage of 0V during the program operation. Hereinafter, a bitline provided with a voltage of 0 volts during a program operation will be referred to as a "program bitline", and a bitline provided with a power supply voltage Vcc during a program operation will be referred to as a "inhibit bitline". Among a plurality of cell strings connected to the program bitline BL<1>, there may be a string where the program bitline BL<1> may be electrically connected to a channel (hereinafter, the string being referred to as "program string"). Among the plurality of cell strings connected to the program bitline BL<1>, there may be a string where the program bitline BL<1> may be electrically isolated from a channel (hereinafter, the string referred to as "inhibit string"). A plurality of string selection lines SSL<0>~SSL<2> may be formed, where each of the string selection lines SSL extends in the X-axis direction to select the inhibit string and the program string.

The cell array 110 having a vertical string structure includes ground selection lines GSL<0>~GSL<2> to individually control the ground selection transistors GST. There may be an inhibit string, among the cell strings connected to the program bitline BL<1>. Because of the increased difficulty of charging a channel of inhibit strings through a bitline, a channel voltage of a inhibit string may not boosted sufficiently at the timing of applying a program voltage to a selected wordline. In this case, program disturbance may occur.

However, a channel of inhibit strings connected to a program bitline may be charged by the ground selection lines GSL<0>~GSL<2> according to the present general inventive concept. That is, a precharge voltage Vpre provided to the common source line CSL may be selectively transferred to the channel of the cell strings by switching one or more of the ground selection lines GSL<0>~GSL<2>. Similar to the string selection lines SSL<0>~SSL<2>, the ground selection lines GSL<0>~GSL<2> may each be electrically isolated and extend in the X-axis direction. Accordingly, each of the ground selection transistors GST may be controlled independently.

The foregoing wordline structure is just an example for describing features of the present general inventive concept. A part of memory cells included in one layer may be connected an electrically insulated another wordline.

The X-, Y-, and Z-axis directions, which are perpendicular to one another, are exemplarily provided to illustrate the vertical cell array 110 having a three-dimensional structure. However, structures of the prevent general inventive concept are not limited to the fact that the X-, Y-, and Z-axis directions are perpendicular to one another.

Figure 3:
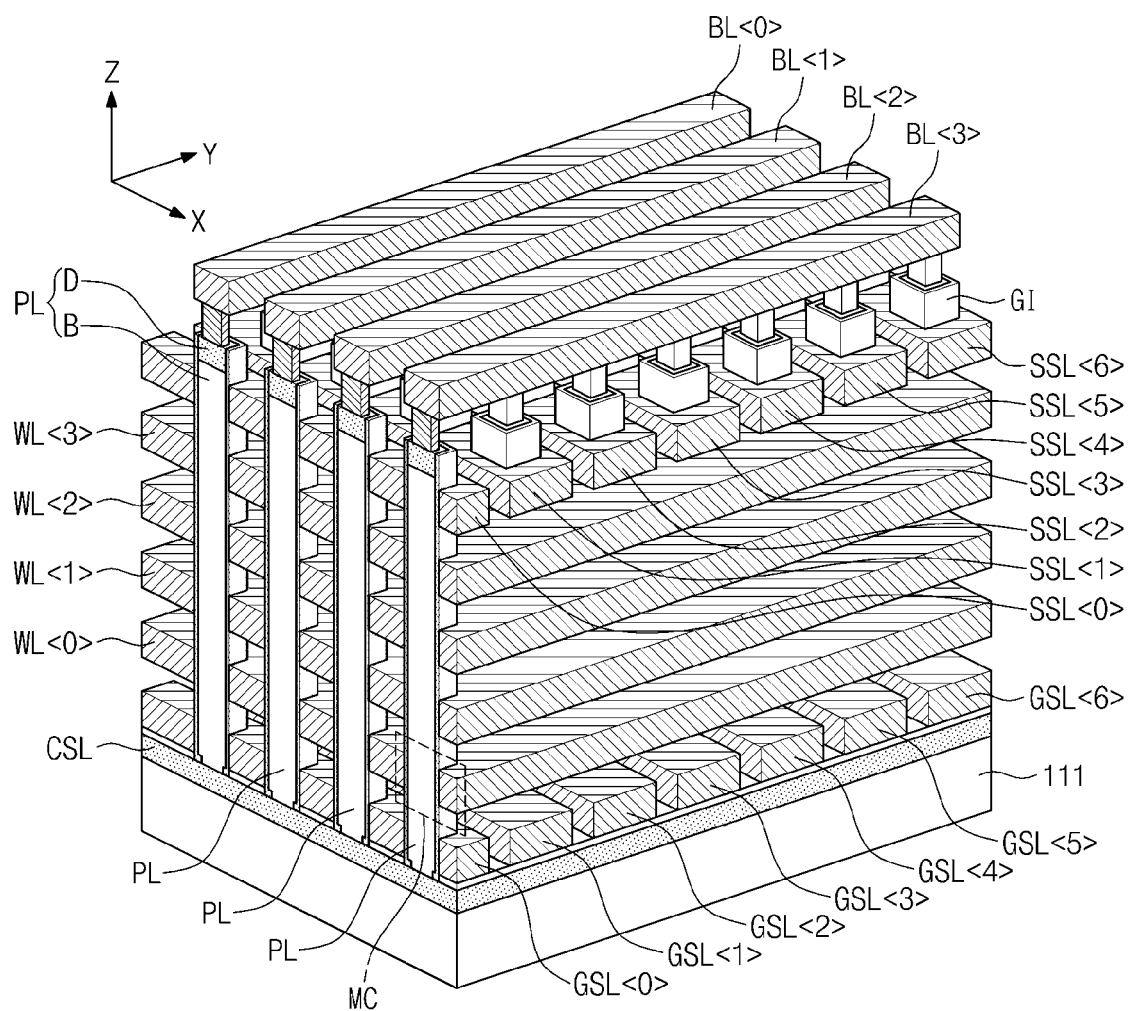
FIG. 3 illustrates a perspective view of the cell array illustrated in FIG. 1.

FIG. 3 illustrates a perspective view of the cell array 110 illustrated in FIG. 1. The cell array 110 of the three-dimensional semiconductor memory device 100 according to some embodiments of the present general inventive concept may include a common source line CSL, a plurality of bitlines BL<0>~BL<3>, and a plurality of cell strings CSTR coupled between the bitlines BL<0>~BL<3> and the common source line CSL.

The common source line CSL may be a conductive thin film disposed on a substrate 111, or an impurity region formed in the substrate 111, or any other suitable material disposed on the substrate 111 which will perform the intended purposes as described herein. The bitlines BL<0>~BL<3> may be conductive patterns (e.g., metal line) which are spaced apart from the substrate 111 to be disposed thereabove. A plurality of the cell strings are connected in parallel to each of the bitlines BL<0>~BL<3> which are arranged two-dimensionally. Thus, cell strings CSTR are two-dimensionally disposed from the common source line CSL or the substrate 111.

Each of the cell strings CSTR may include a ground selection transistor GST connected to the common source line CSL, a string selection transistor SST connected to the bitlines BL<0>~BL<3>, and a plurality of memory cell transistors MCT disposed between the ground and string selection transistors GST and SST. The ground selection transistor GST, the string selection transistor SST, and the memory cell transistors MCT may be coupled in series. Moreover, a plurality of ground selection lines GSL<0>~GSL<6>, a plurality of wordlines WL<0>~WL<3>, and a plurality of string selection lines SSL<0>~SSL<6> disposed between the common source line CSL and the bitlines BL<0>~BL<3> may be used as gate electrodes of the ground selection transistor GST, the memory cell transistors MCT, and the string selection transistors, respectively.

One or more of the ground selection transistors GST may be substantially and equidistantly spaced apart from the substrate 111. These gate electrodes (e.g., ground selection transistors GST to select one or more of the ground selection lines GSL<0>~GSL<6>) may be formed to have a shape divided into a plurality of conductors with respect to the Y-axis direction. That is, each of the ground selection lines GSL<0>~GSL<6> may be formed to intersect the bitlines BL<0>~BL<3>. The ground selection lines GSL<0>~GSL<6> may be provided with different voltages, respectively. The ground selection lines GSL<0>~GSL<6> may be formed as a comb-shaped conductive pattern, which is disposed between the common source line CSL and the most adjacent memory cell transistor MCT.

The gate electrodes of the memory cell transistors MCT substantially and equidistantly spaced apart from the common source line CSL may be connected to one of the wordlines WL<0>~WL<3> to be in an equipotential state. Each of the wordlines WL<0>~WL<3> may be a flat plate-shaped or comb-shaped conductive plate which is parallel with a top surface of the substrate 111. At least one cell string CSTR includes a plurality of memory cell transistors MCT which are differently spaced apart from the common source line CSL. Accordingly, multi-layer wordlines WL<0>~WL<3> are disposed between the common source line CSL and the bitlines BL<0>~BL<3>.

One or more of the cell strings CSTR may include a semiconductor pillar PL which perpendicularly extends from the common source line CSL to be connected to the bitlines BL<0>~BL<3>. The semiconductor pillars PL may be formed to penetrate the ground selection lines GSL<0>~GSL<6> and the word lines WL<0>~WL<3>. Each of the semiconductors pillar PL may include a body B and impurity regions formed at one or both ends of the body B. For example, as illustrated in FIG. 3, the drain region D may be formed at an upper end of the semiconductor pillar PL (i.e., between the body B and the bitlines BL<0>~BL<3>). Ground insulation (GI) may be formed circumferentially around the semiconductor pillar PL to insulate the semiconductor pillar PL.

A data storage layer may be disposed between the wordlines WL<0>~WL<3> and the semiconductor pillar PL. In one or more exemplary embodiments of the present general inventive concept, the data storage layer may be a charge storage layer. The data storage layer may be one of insulting layers such as, for example, a trap insulating layer, a floating gate electrode, and conductive nanodots, or any other suitable layer which will perform the intended purposes as described herein.

A dielectric layer may be disposed between each of the ground selection lines GSL<0>~GSL<6> and each of the semiconductor pillars PL or between each of the string selection lines SSL<0>~SSL<6> and each of the semiconductor pillars PL. The dielectric layer may be a gate insulating layer of the ground selection transistor GST or the string selection transistor SST. Although a gate insulating layer of at least one of the ground and string selection transistors may be formed of the same material as the data storage layer of the memory cell transistor MCT, it may be a gate insulating layer (e.g., silicon oxide layer) for use in a conventional MOSFET.

The ground and string selection transistors GST and SST and the memory cell transistors MCT may be a metal-oxide semiconductor field effect transistor (MOSFET) using a semiconductor pillar PL as a channel region. In other exemplary embodiments of the present general inventive concept, the semiconductor pillars PL with the ground selection lines GSL<0>~GSL<6>, the wordlines WL<0>~WL<3>, and the string selection lines SSL<0>~SSL<6> may be a MOS capacitor. The ground selection transistors GST, the memory cell transistors MCT, and the string selection transistors SST may be electrically connected to each other by sharing inversion layers formed by a fringe field from the ground selection line GSL<0>~GSL<6>, the wordlines WL<0>~WL<3>, and the string selection lines SSL<0>~SSL<6>.

In exemplary embodiments of the present general inventive concept, the bitlines BL<0>~BL<3> and the string selection lines SSL<0>~SS<6> may be formed to intersect with each other. An electrical connection between a predetermined cell string and a predetermined bitline (hereinafter, the electrical connection being referred to as "selective connection") may be controlled by voltages that are applied to the bitlines BL<0>~BL<3> and the string selection lines SSL<0>~SSL<3>, respectively.

According to the exemplary embodiments of the present general inventive concept described with reference to FIGS. 2 and 3, the cell array 110 includes a plurality of ground selection lines GSL<0>~GSL<m−1> (m being a positive integer) which may be independently controlled on a flat plate. Since this structure is similar to a structure of the string selection lines SSL<0>~SSL<m−1>, among a plurality of cell strings connected to a program bitline, a channel of an inhibit string may be charged through a common source line CSL.

Through this structure, a channel of all inhibit strings having a vertical structure may be charged by a bitline or a common source line CSL. Before a program voltage is applied, a floating voltage of the channel of the inhibit strings may be boosted through channel precharge. The boosting of the channel voltage under the floating state provides a high channel boosting efficiency at the timing of applying the program voltage. Thus, unintentional program disturbance of unselected memory cells included in the inhibit strings may be decreased and/or prevented. Hereinafter, the channel charging operation of the inhibit string will now be described in detail with reference to FIGS. 4 to 6.

Figure 4:
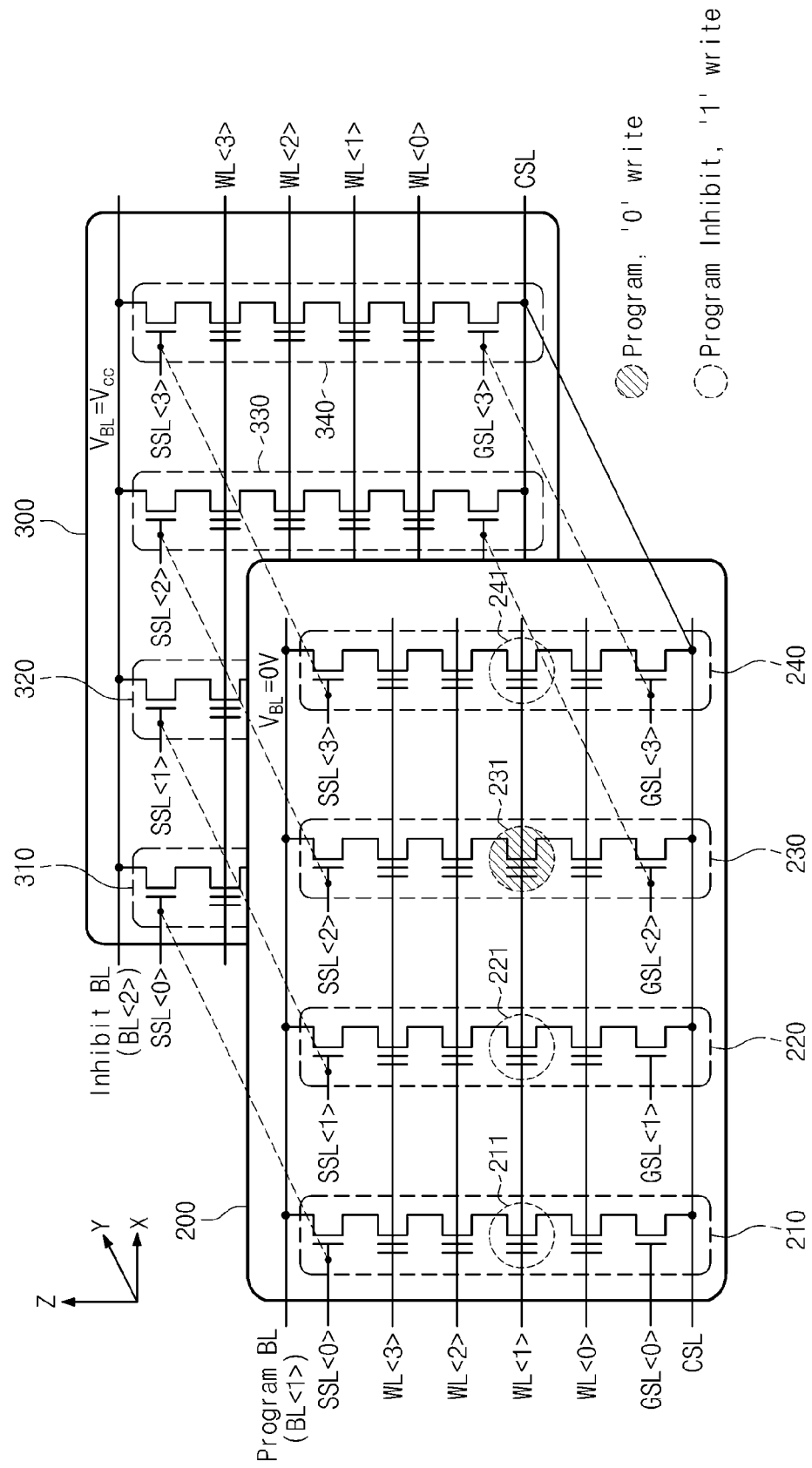
FIG. 4 illustrates a circuit diagram illustrating a portion of the cell array illustrated in FIG. 2.

FIG. 4 illustrates a circuit diagram of cell strings which are connected to a program bitline (e.g., BL<1>) and an inhibit bitline (e.g., BL<2>), respectively. A voltage of 0 volts and a power supply voltage Vcc are applied to the program bitline BL<1> and the inhibit bitline BL<2> during a program operation, respectively. In addition, it is assumed in this example that a program voltage Vpgm and a pass voltage Vpass are applied to a selected wordline WL<1> and unselected wordlines WL<0>, WL<2>, and WL<3>, respectively.

Cell strings are divided into a cell string group 200 connected to the program bitline BL<1> and a cell string group 300 connected to the inhibit bitline BL<2>. The cell string group 200 includes a cell string 230 including a programmed memory cell 231. The cell string group 200 further includes cell strings 210, 220, and 240 respectively including memory cells 211, 221, and 241 that may be inhibited from programming. In exemplary embodiments of the present general inventive concept, the cell strings included in the inhibit bitline BL<2> may be inhibited from programming during the program operation.

Control of the cell string group 200 connected to the program bitline BL<1> will now be described. During a program operation, a voltage of 0 volts is applied to the bitline BL<1> and a power supply voltage Vcc is applied to a string selection line SSL<2> to select a program string 230. The voltage of 0 volts is applied to string selection lines SSL<0>, SSL<1>, and SSL<3> to turn off string selection transistors SST of the respective inhibit strings 210, 220, and 240.

In this case, a channel of the memory cell 231 is electrically connected to the bitline BL<1>. Accordingly, when a program voltage Vpgm is applied to the selected wordline WL<1>, a difference between voltages of a channel and a gate electrode of the memory cell 231 establishes a field which is sufficient to induce FN tunneling. However, a channel of the memory cells 211, 221, and 241 may be boosted, after being floated, when a high voltage (e.g., Vpass or Vpgm) is provided to the selected wordline WL<1>. A channel of an inhibit string may be floated by precharging a channel through a bitline. However, because the bitline BL<1> connected to the inhibit strings 210, 220, and 240 is fixed to the voltage of 0 volts, there may be no channel precharging using the bitline BL<1>.

Therefore, according to the embodiments of the present general inventive concept, a common source line CSL and ground selection lines GSL<0>, GSL<1>, and GSL<3> are used to selectively float the channel of the inhibit strings 210, 220, and 240. Before applying the pass voltage Vpass or the program voltage Vpgm to the wordlines WL<0>~WL<3>, channels of the inhibit strings 210, 220, and 240 are charged and floated to a precharge voltage provided to the common source line CSL. The ground selection lines GSL may be formed to have the structure described in connection with FIGS. 2 and 3, such that a program string and inhibit strings are selectively precharged.

In other words, ground selection lines GSL formed at one layer may be formed of a plurality of insulated conductors intersecting with bitlines. The conductors that are the ground selection lines are insulated from one another to be controlled independently. The conductors may form gate electrodes of ground selection transistors of cell strings, respectively. In exemplary embodiments of the present general inventive concept, the ground selection lines GSL<0>~GSL<3> may be formed to have a shape which is substantially identical to that of the string selection lines SSL<0>~SSL<3> while running over different layers of a multi-layer structure.

Positioned under the above-described structure, the precharge voltage Vpgm is provided through the common source line CSL and the precharge voltage Vpre is provided to each of the ground selection lines GSL<0>, GSL<1>, and GSL<3>. Thus, the channels of the inhibit strings 210, 220, and 240 are each charged up to a floating voltage Vpre-Vth (where Vth is a threshold voltage of a ground selection transistor). When the channels of the inhibit strings 210, 220, and 240 are each charged up to the floating voltage Vpre-Vth, the ground selection transistors GST is turned off and sources of the ground selection transistors GST are each floated. Thus, the channel of the inhibit strings 210, 220, and 240 are each isolated or floated at the level of the floating voltage Vpre-Vth.

Thereafter, when a pass voltage Vpass or a program voltage Vpgm is provided to wordlines, a channel voltage floated at the level of the floating voltage Vpre-Vth is boosted. The greater a channel voltage is boosted at an inhibit string, the less the possibility of occurrence of a program disturbance of unselected memory cells 211, 221, and 241 connected to the selected wordline WL<1>. For at least this reason, the programming method according to the present general inventive concept makes it possible to effectively reduce and/or prevent program disturbance of memory cells connected to the program bitline BL<1>.

The control of the cell string group 300 connected to the inhibit bitline BL<2> will now be described in detail. During the program operation, a power supply voltage Vcc is applied to the inhibit bitline BL<2>. A voltage provide to the string selection lines SSL<0>~SSL<3> are equivalent to that of the above-described cell string group 200 connected to the program bitline BL<1>. That is, the power supply voltage Vcc applied to the string selection line SSL<2> for selecting the program string 230 is equivalently applied to a string selection transistor of the inhibit string 330. A voltage of 0 volts is applied to the string selection lines SSL<0>, SSL<1>, and SSL<3> to block selection of the inhibit strings 210, 220, and 240.

The inhibit string 330 shares the string selection line SSL<2> and the ground selection line GSL<2> with the program string 230. Accordingly, during the program operation, except a bitline voltage, bias conditions of the inhibit string 330 may be the same as those of the program string 230. That is, during the program operation, the string selection line SSL<2> and the ground selection line GSL<2> of the inhibit string 330 are biased the same as the program string 230. Precharging and floating the channel of the inhibit string 330 through the common source line CSL is decreased. The channel of the inhibit string 330 may be precharged and floated through the bitline BL<2>. That is, the channel of the inhibit string 330 may be precharged and floated using the power supply voltage provided to the bitline BL<2>.

Although the inhibit strings 310, 320, 340 are connected to the inhibit bitline BL<2>, a voltage of 0 volts is applied to the string selection lines SSL<0>, SSL<1>, and SSL<3>. Thus, each of the inhibit strings 310, 320, and 340 are electrically insulated from the inhibit bitline BL<2> during the program operation. The respective channels of the inhibit strings 310, 320, and 340 may not be recharged using the inhibit bitline BL<2>. However, the respective channels of the inhibit strings 310, 320, and 340 may be precharged using the same manner as the inhibit strings 210, 220, and 240. The precharge operation of the respective channels of the inhibit strings 310, 320, and 340 will be described below with reference to FIG. 5.

According to the foregoing, the channel of the inhibit strings 210, 220, and 240 connected to the same program bitline BL<1> as the program string 230 is connected to the common source line CSL through the ground selection lines GSL<0>~GSL<3> which are electrically insulated from one another. Thus, the channel of the inhibit strings 210, 220, and 240 may be selectively charged to the precharge voltage Vpre provided to the common source line CSL. The channel of the inhibit string 330, which is connected to the inhibit bitline BL<2> and shares the string selection line SSL<2> with the program string 230, may be charged to the power supply voltage Vcc provided to the inhibit bitline BL<2>. The channel of the inhibit strings 310, 320, and 340, which are connected to the inhibit bitline BL<2> and do not share a string selection line and a ground selection line, may be charged to the precharge voltage Vpre provided to the common source line CSL.

Figure 5:
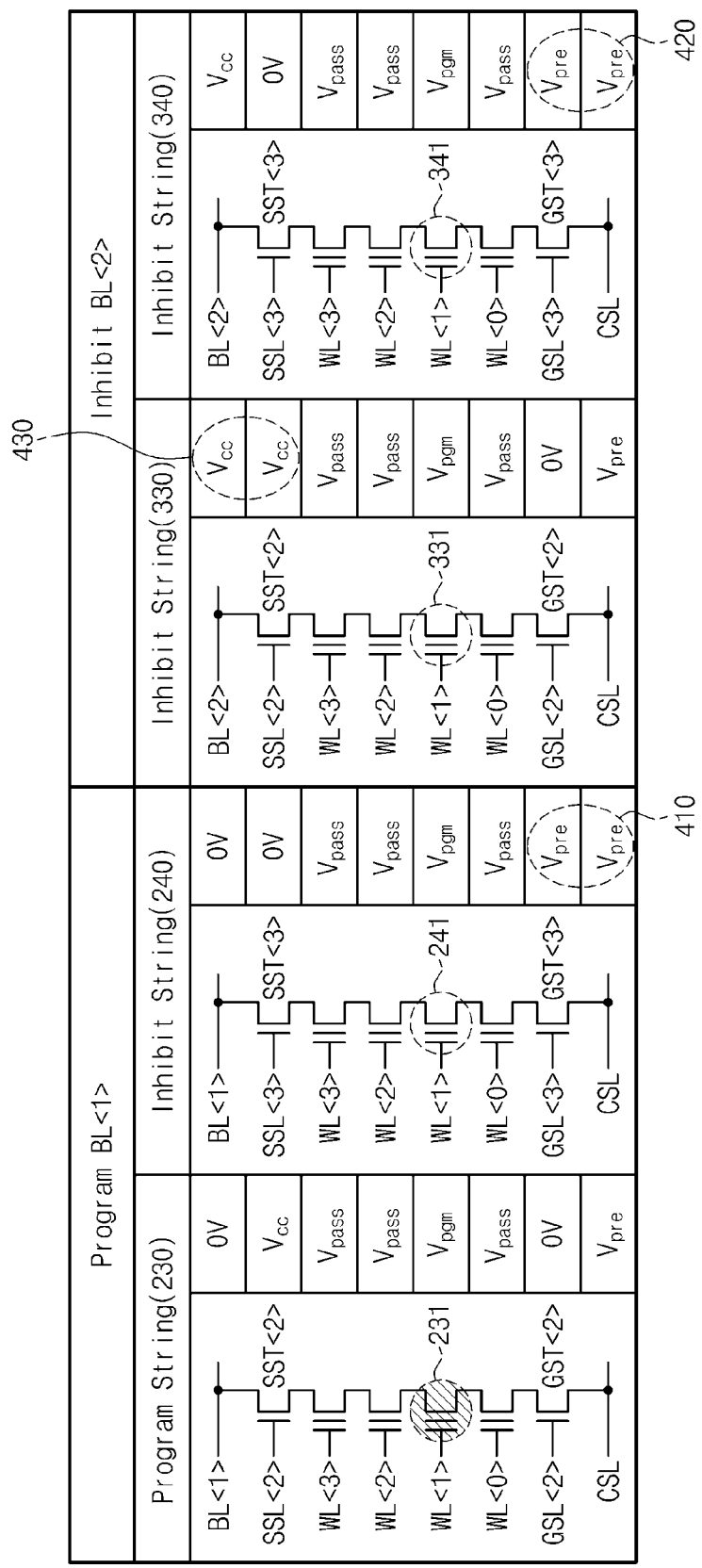
FIG. 5 is a table illustrating bias conditions of circuits illustrated in FIG. 4.

FIG. 5 is a table illustrating bias conditions applied to the circuit diagram illustrated in FIG. 4. During a program operation, a voltage of 0 volts is applied to a program bitline BL<1> and a power supply voltage Vcc is applied to an inhibit bitline BL<2>. Cell strings connected to the program bitline BL<1> include a cell 231 to be programmed and an inhibit string 240 that includes cell 241 inhibited from programming. Cell strings connected to the inhibit bitline BL<2> include a cell 331 to be inhibited and an inhibit string 340 that includes cell 341 inhibited from programming.

A bias condition of the program string 230 connected to the program bitline BL<1> is illustrated in the table of FIG. 5. That is, a voltage of 0 volts is applied to the bitline BL<1> and a power supply voltage Vcc is applied to a string selection line SSL<2>. A program voltage Vpgm is applied to a selected wordline WL<1> and a pass voltage Vpass is applied to unselected wordlines WL<0>, WL<1>, and WL<3> to program a memory cell 231. A voltage of 0 volts is applied to a ground selection line GSL<2>. During a program operation, a precharge voltage Vpre is applied to a common source line CSL to charge and float a channel of an inhibit string. The memory cell 231 may be programmed by FN tunneling.

A bias condition of the inhibit string 240 connected to the program bitline BL<1> will now be described. A voltage of 0 volts is applied to the bitline BL<1>, and a voltage of 0 volts is applied to a string selection line SSL<3> to block selection of the inhibit selection 240. Under this condition, precharging a channel of the inhibit string 240 through the bitline BL<1> is decreased. A channel voltage of the inhibit string 240 boosted by a high voltage provided to wordlines WL<0>~WL<3> may not be high enough to decrease and/or fully prevent soft programming of the memory cell 241. Therefore, the channel of the inhibit string may be charged using a ground selection line GSL<3> which may be controlled independently of the ground selection line GSL<2>. A bias condition of the ground selection line GSL<3> and the common source line CSL of the inhibit string 240 connected to the program bitline BL<1> is represented as a reference numeral 410.

Cell strings connected to an inhibit bitline BL<2> provided with a power supply voltage Vcc all correspond to inhibit strings. However, a channel of an inhibit string 330 sharing the string selection line SSL<2> with the program string 230 may not be precharged using the common source line CSL because the inhibit string 330 shares the ground selection with the program string 230. However, during the program operation, the channel of the inhibit string 330 may be precharged using the bitline BL<2> receiving the power supply voltage Vcc. That is, when the power supply voltage Vcc is provided to the inhibit bitline BL<2> and the string selection line SSL<2>, the channel of the inhibit string 330 may be charged to a floating voltage Vcc-Vth. Thereafter, a string selection transistor SST<2> is turned off. That is, the channel of the inhibit string 330 is floated at the level of the floating voltage Vcc-Vth. A bias condition of the ground selection line GSL<2> and the common source line CSL of the inhibit string 330 connected to the inhibit bitline BL<2> is represented as a reference numeral 430.

An inhibit string 340 connected to the inhibit bitline BL<2> shares the string selection line SSL<3> with the inhibit string 340. Accordingly, during a voltage of 0 volts is applied to the string selection line SSL<3> to block selection of the inhibit selection 340. Under this condition, the channel of the inhibit string 240 may not receive the precharge voltage Vpre from the bitline BL<2> even when the power supply voltage Vcc is applied to the inhibit bitline BL<2>. Similar to the inhibit string 240, the channel of the inhibit string 340 may be precharged through the common source line CSL. When the precharge voltage Vpre is applied to the ground selection line GSL which may be controlled independently of the ground selection line GSL<2>, the channel of the inhibit string 340 may be charged. A bias condition of the ground selection line GSL<3> and the common source line CSL of the inhibit string 340 connected to the inhibit bitline BL<2> is represented as a reference numeral 420.

A bias manner of the inhibit string 240 and the program string 230 connected to the program bitline BL<1> have been exemplarily described above. Also, charging and floating a channel of inhibit strings connected to the inhibit bitline BL<2> have been exemplarily described with respect to the inhibit strings 330 and 340. A channel of inhibit strings sharing the string selection line SSL<2> and the ground selection line GSL<2> with the program string 230 may be precharged to a power supply voltage Vcc provided to a bitline. A channel of inhibit strings not sharing the string selection line SSL<2> and the ground selection line GSL<2> with the program string 230 may be precharged to a precharge voltage Vpre provided through a common source line CSL.

Note that the precharge voltage Vpre provided to the common source line CSL of the inhibit strings 240 and 340 and the precharge voltage Vpre provided to the ground selection line GSL<3> may not be equal to each other. In other words, the precharge voltage Vpre provided to the common source line CSL may be higher or lower than the precharge voltage Vpre provided to the ground selection line GSL<3>. This relationship is applied to a voltage applied to the bitline BL<2> of the inhibit string 330 and a voltage applied to the string selection line SSL<2>. That is, the voltage provided to the string selection line SSL<2> may be higher or lower than a power supply voltage Vcc.

Figure 6:
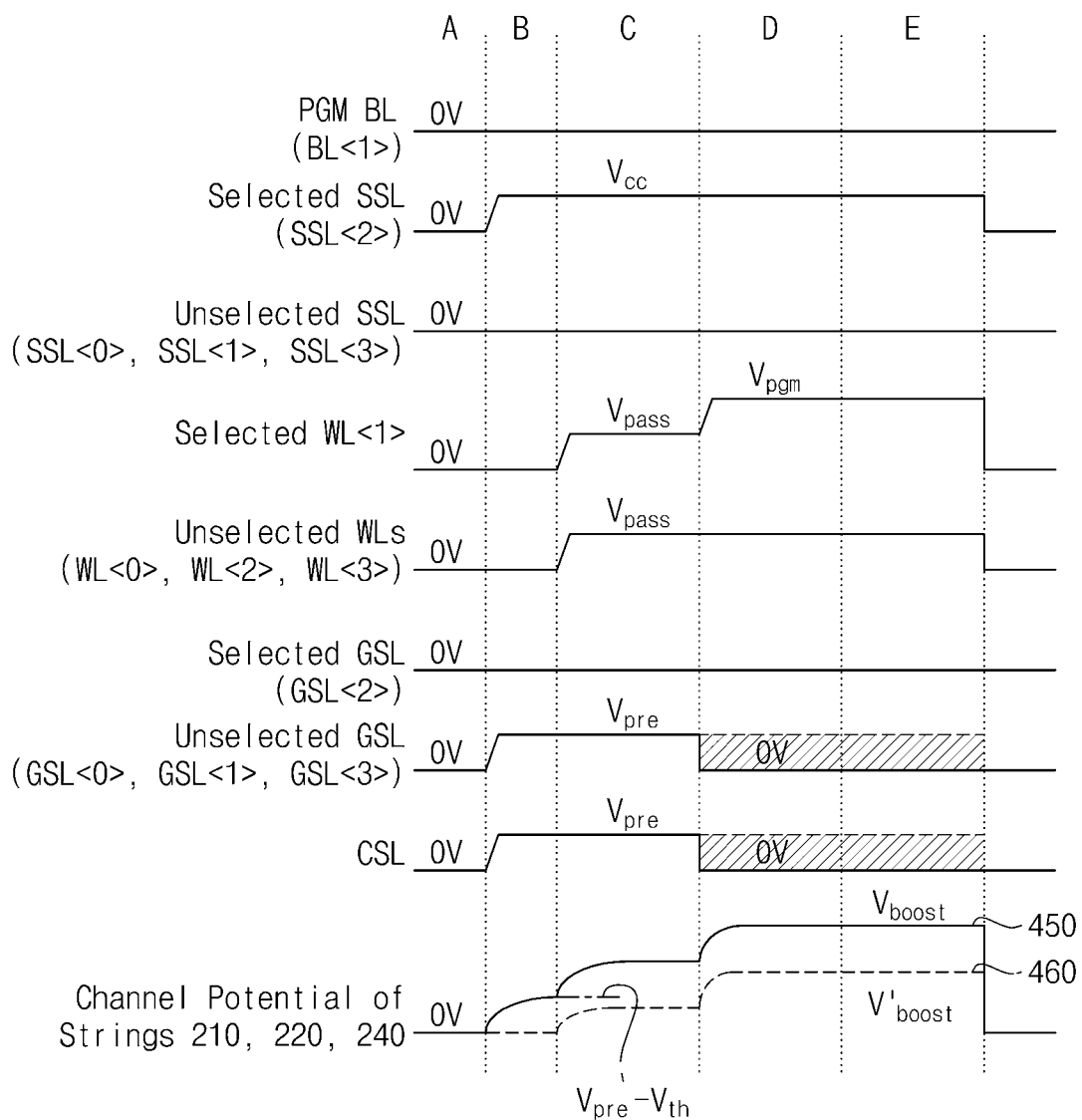
FIG. 6 is a timing diagram illustrating a bias procedure of cell strings connected to a program bitline.

FIG. 6 is a timing diagram illustrating a bias method of cells strings connected to the program bitline BL<1> illustrated in FIG. 4. In FIG. 6, a bias condition of inhibit strings 210, 220, and 240 connected to the program bitline BL<1> maintained at 0 volts is illustrated with the lapse of time over time periods A, B, C, D, and E. The bias condition is now described below in detail.

At a period A, a bias state before starting a program operation is illustrated. It is assumed that string selection lines SSL<0>~SSL<3>, wordlines WL<0>~WL<3>, and ground selection lines GSL<0>~GSL<3> are initialized to 0 volts at the period A. Therefore, a channel voltage of the inhibit strings 210, 220, and 240 may be 0 volts.

At a period B, the program string 230 is electrically connected to the program bitline BL<1>, and the inhibit strings 210, 220, and 240 are charged with electrical charges provided from the common source line CSL. A power supply voltage Vcc is applied to the string selection line SSL<2> and a voltage of 0 volts is applied to the ground selection line GSL<2> to electrically connect the program string 230 to the program bitline BL<1>. Then the ground selection transistor GST<2> is turned off to electrically insulate a channel of the program string 230 from the common source line CSL, while the string selection transistor SST<2> is turned on to electrically connect the channel of the program string 230 to the bitline BL<1>.

However, during the period B, a channel of the inhibit strings 210, 220, and 240 is charged with electrical charges provided from the common source line CSL. Thus, string selection transistors (SST<0>, SST<1>, and SST<3> in FIG. 5) may be turned off to be electrically insulated from the program bitline BL<1> maintained at 0 volts. The precharge voltage Vpre may be provided to the common source line CSL and the ground selection lines GSL<0>, GSL<1>, and GSL<3> to charge the channel of the inhibit strings 210, 220, and 240. A source or a channel of the ground selection transistors GST<0>, GST<1>, and GST<3> is turned off after being charged up to a floating voltage Vpre-Vth (Vth being a threshold voltage of GST). The source of the ground selection transistors GST<0>, GST<1>, and GST<3> or a channel of the inhibit strings 210, 220, and 240 may operate in a floating state. At the period B, a power to the wordlines WL<0>~WL<3> may not be provided yet.

At a period C, a pass voltage Vpass is provided to the wordlines WL<0>~WL<3>. Thus, the channel of the inhibit strings 210, 220, and 240 maintained at the floating state is boosted by the coupling effect.

At periods D and E, a program voltage Vpre is applied only to a selected wordline WL<1>. Thus, a channel voltage of the inhibit strings 210, 220, and 240 is boosted up to a boosted voltage Vboost. Under this condition, among memory cells of the inhibit strings 210, 220, and 240, a gate-channel voltage difference of memory cells connected to the selected wordline WL<1> becomes small enough to minimize and/or prevent program interference from occurring at the inhibit strings 210, 220, and 240 connected to the program bitline BL<1>. At the periods D and E, a voltage of the common source line CSL and unselected ground selection lines GSL<0>, GSL<1>, and GSL<3> corresponding to the inhibit strings 210, 220, and 240 may transition to a voltage of 0 volts or may be maintained at the precharge voltage Vpre.

As illustrated in FIG. 6, a channel voltage fluctuation of the inhibit strings 210, 220, and 240 according to exemplary embodiments of the present general inventive concept is represented as a curve 450. When the inhibit strings 210, 220, and 240 are not precharged, a channel voltage fluctuation is represented as a curve 460. It will be understood that a boosted voltage Vboost of an inhibit channel according to exemplary embodiments of the present general inventive concept becomes higher than a channel boosted voltage V'boost of non-precharged inhibit strings. Thus, the program interference may be efficiently minimized and/or prevented at the inhibit strings 210, 220, and 240 connected to the program bitline BL<1> to enhance reliability of programmed data.

The higher the precharge voltage Vpre provided to the ground selection lines GSL<0>, GSL<1>, and GSL<3> or the common source line CSL, the higher a voltage of a floated channel. However, when the voltage of the common source line CSL is boosted over a predetermined level, a ground selection transistor of a program string may be turned on. In this case, a channel voltage of the program string may be boosted. Therefore, the precharge voltage may be defined at a level according to the voltage of the floated channel and when the voltage of the common source line CSL is boosted over the predetermined level.

Figure 7:
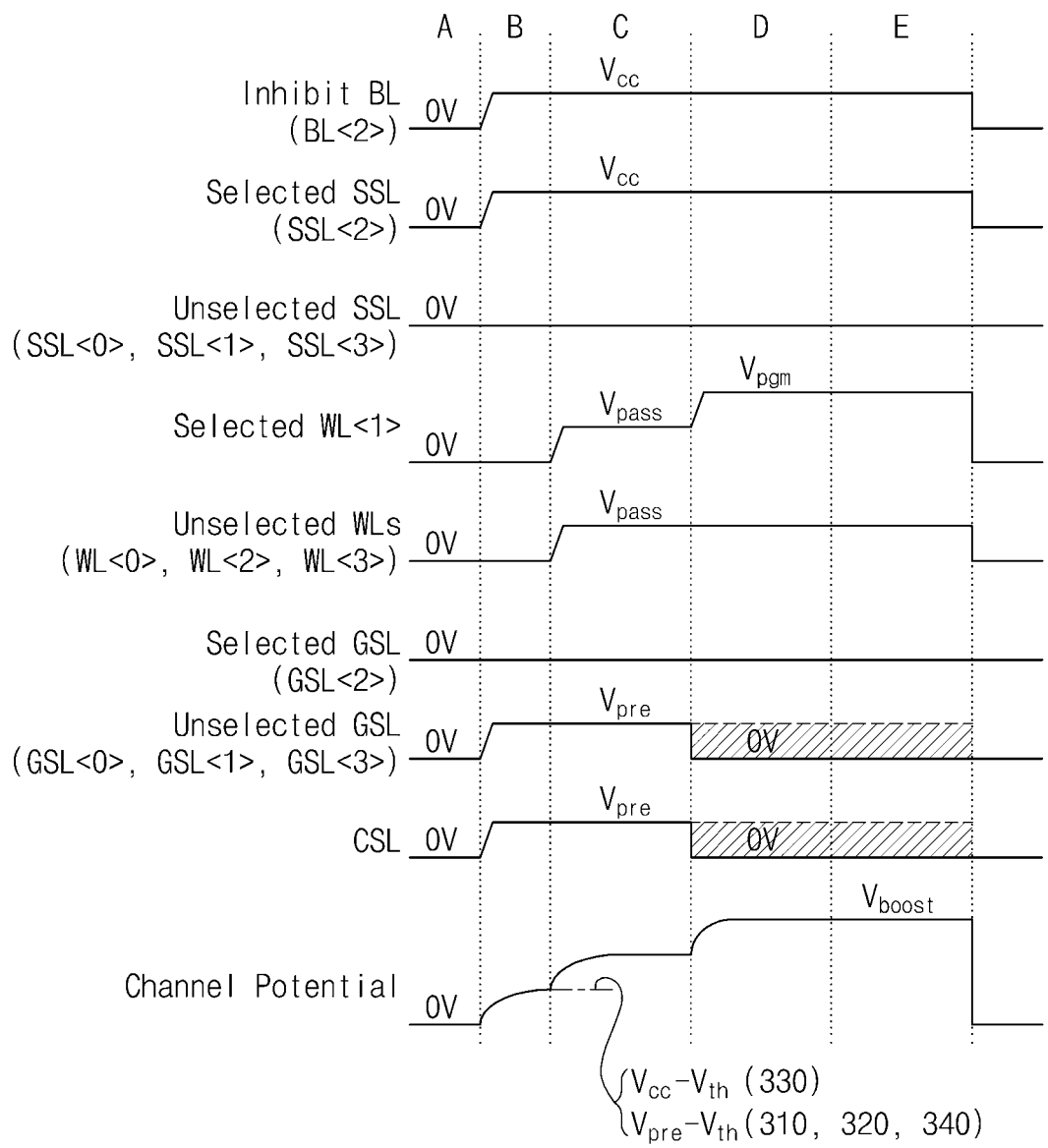
FIG. 7 is a timing diagram illustrating a bias procedure of cell strings connected to an inhibit bitline.

FIG. 7 illustrates a timing diagram illustrating a bias method of cell strings connected to the inhibit bitline BL<2> illustrated in FIG. 4. Referring to FIG. 7, the inhibit bitline BL<2> is maintained at a power supply voltage Vcc during a program operation mode (periods B-E). The inhibit strings connected to the inhibit bitline BL<2> may include a cell string (e.g., 300) sharing a string selection line SSL<2> with the program bitline BL<1>. Further, the inhibit strings connected to the inhibit bitline BL<2> may include string selection lines SSL<0>, SSL<1>, and SSL<3> sharing string selection lines SSL<0>, SSL<1>, and SSL<3> with the inhibit strings 210, 220, and 240 connected to the program bitline BL<1>. Channel precharging and floating procedures of the inhibit strings 310, 320, 330, and 340 are illustrated with the lapse of time over time periods A, B, C, D, and E. The channel precharging and floating procedures will now be described below in detail.

At a period A, a bias state before starting a program operation is illustrated. In this example, it is assumed that string selection lines SSL<0>~SSL<3>, wordlines WL<0>~WL<3>, ground selection lines GSL<0>~GSL<3>, and a common source lines CSL are initialized to 0 volts at the period A. Accordingly, a channel voltage of the inhibit strings 310, 320, 330, and 340 may also be 0 volts.

At a period B, the inhibit bitline BL<2> and the string selection SSL<2> are provided with a power supply voltage Vcc. Because the inhibit string 330 shares the program string 230 with the string selection line SSL<2>, the string selection line SSL<2> is provided with the power supply voltage Vcc. In connection with FIG. 6, it is described that the power supply voltage Vcc is applied to the string selection line SSL<2> to electrically connect the channel of the program string 220 to the program bitline BL<1>.

When the power supply voltage Vcc is applied to the inhibit bitline BL<2> and the string selection line SSL<2>, a source of the string selection transistor SST<2> or a channel of the inhibit string 330 is charged up to a floating voltage Vcc-Vth (Vth being a threshold voltage of SST<2>). At the timing when gate-source voltage Vgs of the string selection transistor SST<2> reaches the threshold voltage Vth of the string selection transistor SST<2>, the string selection transistor SST<2> is turned off. Then the source of the string selection transistor SST<2> or the channel of the inhibit string 330 goes to a floating state at the level of Vcc-Vth.

Since the inhibit strings 310, 320, and 340 are set to 0 volts, their channel is precharged through the common source line CSL and floated. A precharge voltage Vpre is provided to the common source line CSL and the ground selection lines GSL<0>, GSL<1>, and GSL<3> to precharge and float the channel of the inhibit strings 310, 320, and 340. Thus, a source of ground selection transistors GST<0>, GST<1>, and GST<3> or a channel of the inhibit strings 310, 320, and 340 is turned off after being charged up to a floating voltage Vpre-Vth (Vth being a threshold voltage of GST). A source of the ground selection transistors GST<0>, GST<1>, and GST<3> or a channel of the inhibit strings 310, 320, and 340 goes to a floating state.

At a period C, a pass voltage Vpass is provided to the wordlines WL<0>~WL<3>. The channel of the inhibit strings 310, 320, 330, and 340 that is maintained at the floating state may be boosted by the coupling effect. Thus, a channel voltage of the inhibit strings 310, 320, 330, and 340 may also be boosted.

At the periods D and E, a program voltage Vpre is applied only to a selected wordline WL<1>. Thus, the channel voltage of the inhibit strings 310, 320, 330, and 340 is boosted to reach a boosted voltage Vboost. Under this condition, among memory cells of the inhibit strings 310, 320, 330, and 340 a gate-channel voltage difference of memory cells connected to the selected wordline WL<1> may become small enough to prevent program interference from occurring at the inhibit strings 310, 320, 330, and 340 connected to the inhibit bitline BL<2>.

As illustrated in FIG. 7, the inhibit strings 310, 320, 330, and 340 according to exemplary embodiments of the present general inventive concept may be charged through the bitline BL<2> or the common source line CSL. During a program operation, a channel voltage of the charged inhibit strings 310, 320, 330, and 340 may be charged to be sufficiently high such that the inhibit strings 310, 320, 330, and 340 may be free from program interference.

Figure 8B:
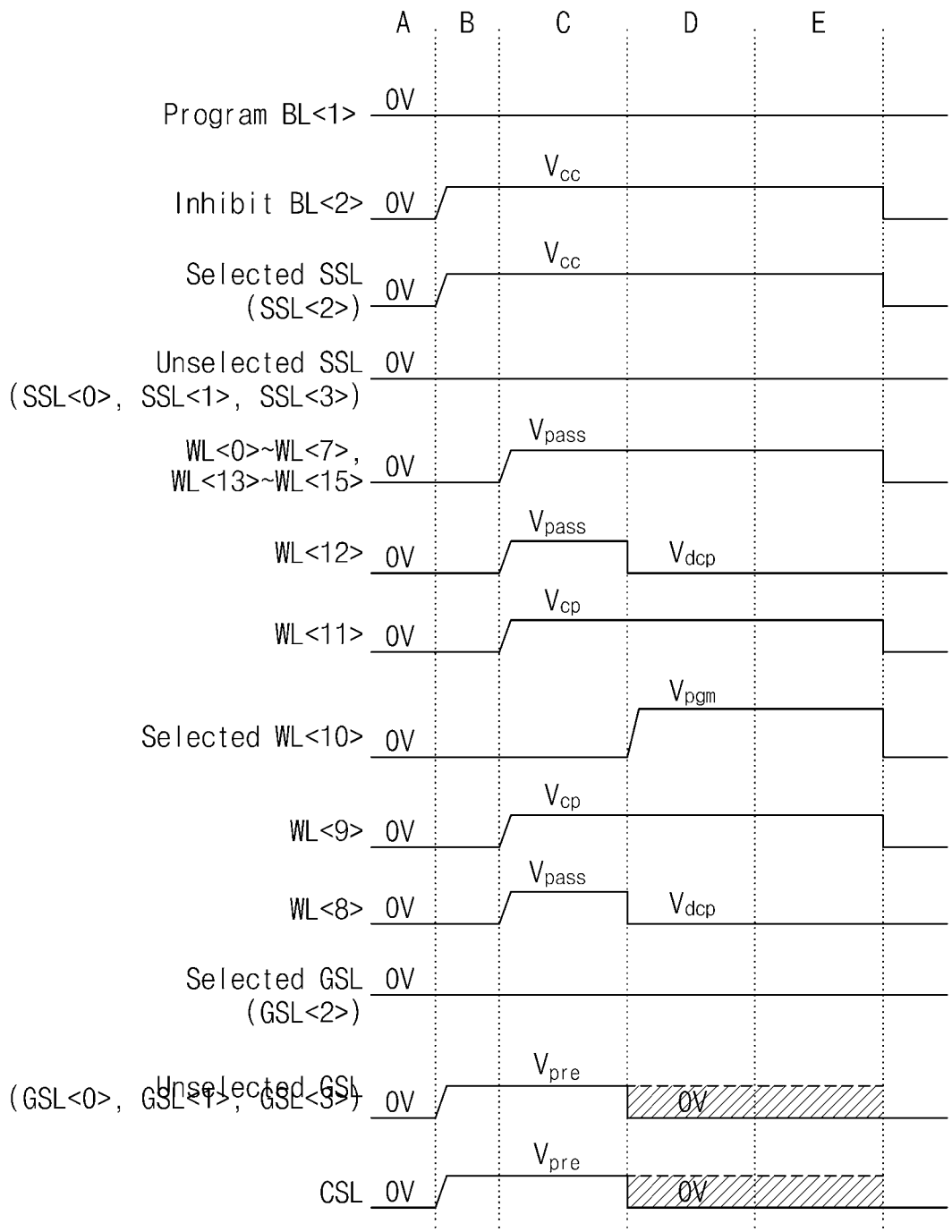
Figure 8C:
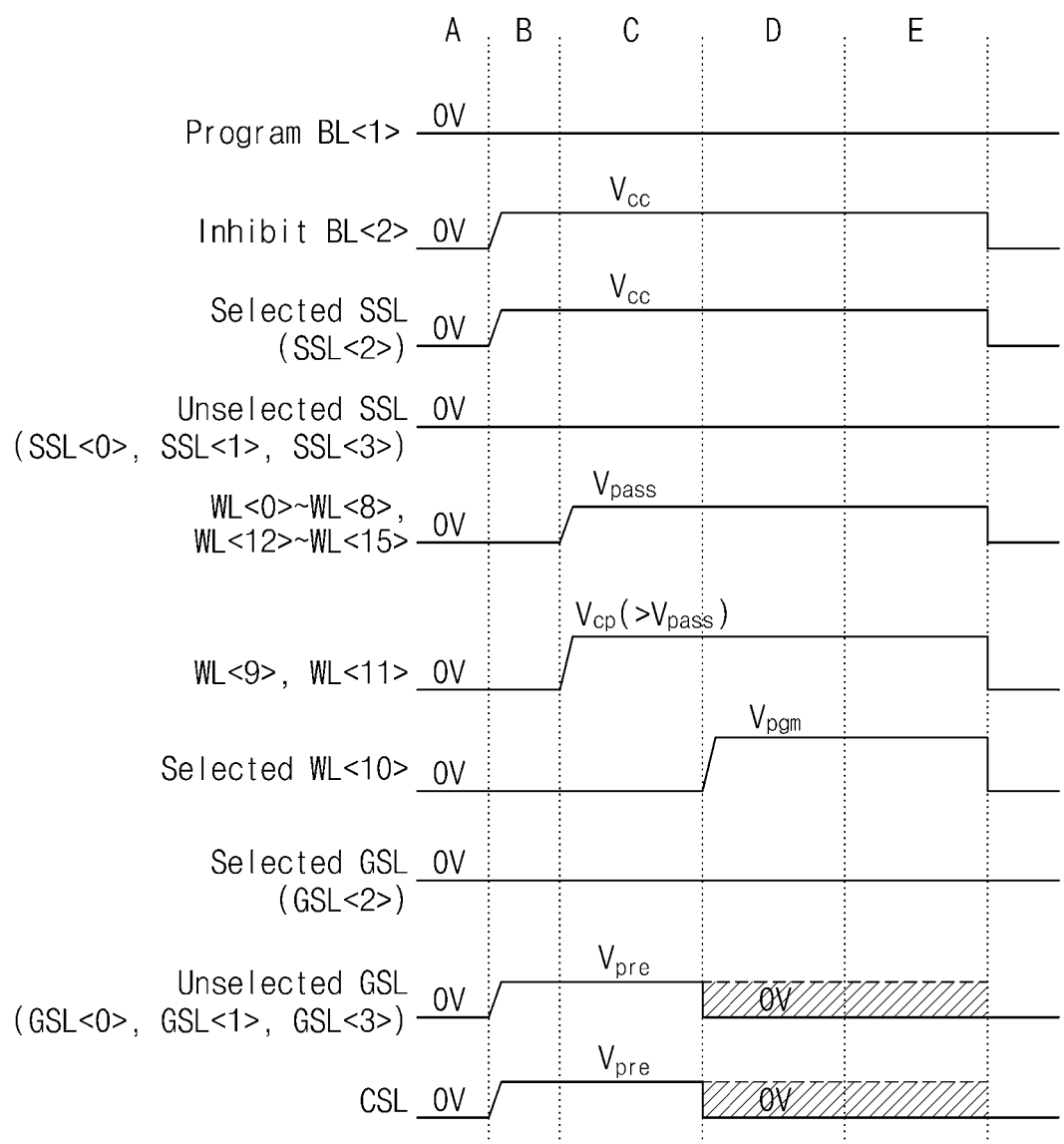

FIGS. 8A to 8C are timing diagrams for time periods A, B, C, D, and E illustrating programming methods according to exemplary embodiments of the present general inventive concept.

In of the exemplary embodiments illustrated in FIG. 8A, at least two levels of a pass voltage Vpass provided to wordlines WL<0>~WL<3> during a program operation are illustrated. In this example, it is assumed that, except a wordline voltage applied to a wordline, a bias condition is similar and/or identical to that described in connection with FIGS. 6 and 7. Accordingly, bias conditions of bitlines BL<1> and BL<2>, string selection lines SSL<0>~SSL<3>, ground selection lines GSL<0>~GSL<3>, and a common source line CSL will be described in brief.

At a period B, a program string 230 is electrically connected to the program bitline BL<1> and an inhibit string 240 is charged with electric charges provided from the common source line CSL. In addition, an inhibit string 330 is charged to a common source line Vcc provided from the bitline BL<2> and the inhibit string 340 is charged with electric charges provided from the common source line CSL. Channels of respective inhibit strings 240, 330, and 340 are floated by the charging.

At a period C, pass voltages Vpass0~Vpass3 of a plurality of levels are provided to the wordlines WL<0>~WL<3>. The levels of the pass voltages Vpass0~Vpass3 are sufficient to effectively boost a channel voltage of the floated inhibit strings 240, 330, and 340. That is, the pass voltage Vpass3 of a relatively high level may be controlled to be provided to a wordline closer to a ground selection line GSL. Alternatively, the pass voltage Vpass3 of a relatively high level may be set to be provided to a wordline closer to the ground selection line GSL. Alternatively, levels of pass voltages applied to unselected wordlines may be variously modified depending on a position of a selected wordline. As such, when the pass voltages Vpass0~Vpass3 of a plurality of levels are applied to unselected wordlines, the channel of the inhibit strings 240, 330, and 340 maintained at a floating state is boosted due to the coupling effect.

At periods D and E, a program voltage Vpgm is applied only to the selected wordline WL<1>. Thus, a channel voltage of the inhibit strings 240, 330, and 340 is boosted to a boosted voltage (not illustrated). Under this condition, among memory cells of the inhibit strings 210, 220, and 240, a gate-channel voltage difference of memory cells connected to the selected wordline WL<1> may become small enough to prevent program disturbance from occurring at the inhibit strings 240, 330, and 340 connected to the program bitline BL<1>. A voltage of unselected ground selection lines GSL<0>, GSL<1>, and GSL<3> corresponding to a common source line CSL and the inhibit strings 240, 330, and 340 may transition to a voltage of 0 volts or may be maintained at a precharge voltage Vpre.

FIGS. 8B and 8C are timing diagrams illustrating programming methods according to exemplary embodiments of the present general inventive concept. These exemplary timing diagrams and the description related thereto assume that a cell string has a structure where 16 memory cells are serially connected to one cell string.

Referring to FIG. 8B, at a period B, a program string 230 is electrically connected to a program bitline BL<1> and an inhibit string 240 is charged with electric charges provided from a common source line CSL. In addition, an inhibit string 330 is charged to a power supply voltage Vcc provided from a bitline BL<2> and an inhibit string 340 is charged to electric charges provided from the common source line CSL. A channel of respective inhibit strings 240, 330, and 340 is floated by the charging.

At a period C, a coupling voltage Vcp is applied to two unselected wordlines (e.g., WL<9> and WL<11>) most adjacent to a selected wordline (e.g., WL<10>) and a pass voltage Vpass is applied to the other unselected wordlines (e.g., WL<0>~WL<8> and WL<12>~WL<15>). Alternatively, as illustrated in FIG. 8B, the voltage of 0 volts may be applied to wordlines WL<8> and WL<12> adjacent to wordlines WL<9> and WL<11>.

At a period D, the voltage of the unselected wordlines WL<8> and WL<12> fluctuates to a decoupling voltage Vdcp from the pass voltage Vpass. In addition, a program voltage Vpgm is applied to the selected wordline WL<10>. A coupling voltage Vcp is applied to two unselected wordlines (e.g., WL<9> and WL<11>) most adjacent to a selected wordline (e.g., WL<10>), and a decoupling voltage Vdcp is applied to unselected wordlines WL<8> and Wl<12>. A pass voltage Vpass is applied to the other unselected wordlines (e.g., WL<0>~WL<7> and WL<13>~WL<15>). The coupling voltage Vcp may be higher than a voltage of 0 volts and lower than or equal to a pass voltage Vpass.

According to the foregoing programming method, a coupling voltage Vcp greater than a voltage of 0 volts is applied to unselected memory cell transistors adjacent to a memory cell transistor to be programmed in the same cell string. In addition, a decoupling voltage Vdcp of 0 volts is applied to transistors adjacent to unselected memory cell transistors to increase a voltage induced to a gate of the cell transistor to be programmed. Thus, a coupling effect from an unselected wordline may be minimized. As a result, a gate-channel voltage difference of a selected wordline may be raised to improve program speed.

FIG. 8C is a timing diagram illustrating programming methods according to exemplary embodiments of the present general inventive concept. Referring to FIG. 8C, at a period C, a coupling voltage Vcp is applied to two unselected wordlines (e.g., WL<9> and WL<11>) most adjacent to a selected wordline WL<10> and a pass voltage Vpass is applied to the other unselected wordlines (e.g., WL<0>~WL<8> and WL<12>~WL<15>). The coupling voltage Vcp may be higher than the pass voltage Vpass. The coupling voltage Vcp is set to a predetermined level to increase the coupling effect of a floating gate of a cell transistor to be programmed. The increased coupling effect increases the program speed.

In the foregoing exemplary embodiments, variations of level of a pass voltage Vpass have been described. However, the level of voltages applied to a wordline is not limited thereto. Moreover, a precharge voltage Vpre provided to a common source line CSL and a precharge voltage Vpre provided to a ground selection line GSL may be provided at different levels.

FIGS. 9A and 9B, FIG. 10, and FIG. 11 illustrate perspective views of three-dimensional memory devices employing a programming method according to the exemplary embodiments of the present general inventive concept, respectively. In the figures, duplicate explanations of those made in connection with FIG. 3 will be omitted for brevity of description.

Figure 9A:
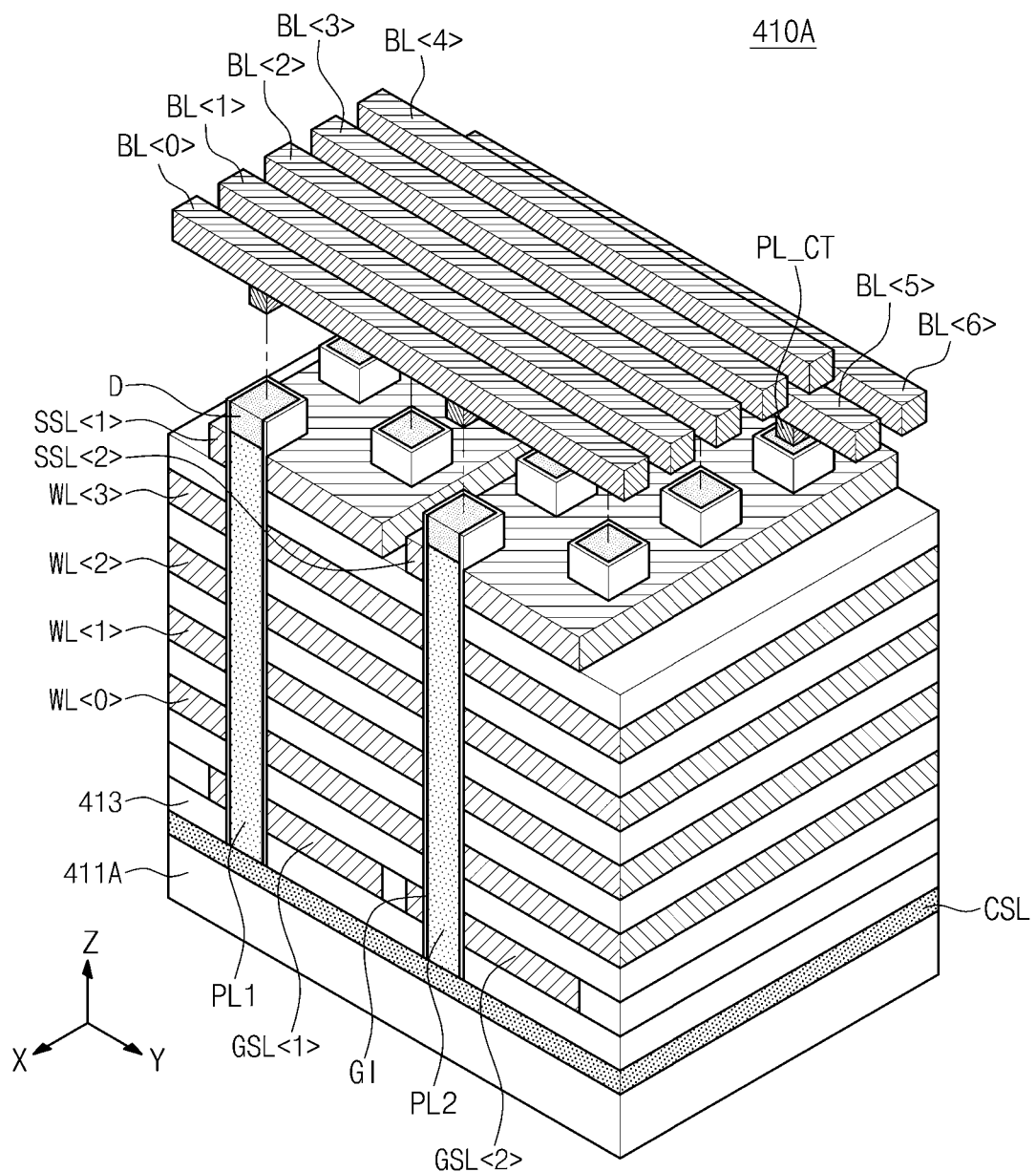
FIGS. 9A and 9B are a perspective view and a circuit diagram illustrating a structure of a three-dimensional memory device and the programming method according to the present general inventive concept, respectively.

Referring to FIG. 9A, a three-dimensional memory device 410A formed on substrate 411A may include two string selection lines SSL<1> and SSL<2> disposed at an upper portion thereof. The string selection line SSL<1> may control electrical connection between active pillars PL1 having the string selection line SSL<1> as a gate and bitlines BL<0>~BL<6>. The string selection line SSL<2> may control electrical connection between active pillars PL2 having the string selection line SSL<2> as a gate and the bitlines BL<0>~BL<6>. In exemplary embodiments of the present invention, the pillar cell transistor PL_CT may control an electrical connection between the bitlines BL<0>~BL<6> and the semiconductor pillar (e.g., first semiconductor pillar PL1, second semiconductor pillar PL2, etc.) While two string selection lines SSL<1> and SSL<2> are illustrated in this figure, the number of the string selection lines is not limited thereto. As illustrated, the string selection lines SSL<1> and SSL<2> may be selection plates and extend in the X-axis direction.

Similar to the string selection lines SSL<1> and SSL<2>, the three-dimensional memory device 410A may include two ground selection lines GSL<1> and GSL<2> disposed at a lower portion thereof. The ground selection lines GSL<1> and GSL<2> may have the same width as the string selection lines SSL<1> and SSL<2>. A pair of the string selection line SSL<1> and the ground selection line GSL<1> may control the same active pillars that are perpendicularly aligned. Active pillars PL may be formed to penetrate the string selection lines SSL<1> and SSL<2> and the ground selection lines GSL<1> and GSL<2>.

FIG. 9A illustrates the three-dimensional memory device 410A including a plurality of ground selection lines GSL<1> and GSL<2> which are electrically insulated from each other. Thus, a precharge voltage Vpre provided to a common source line CSL may be selectively applied to inhibit strings.

Figure 9B:
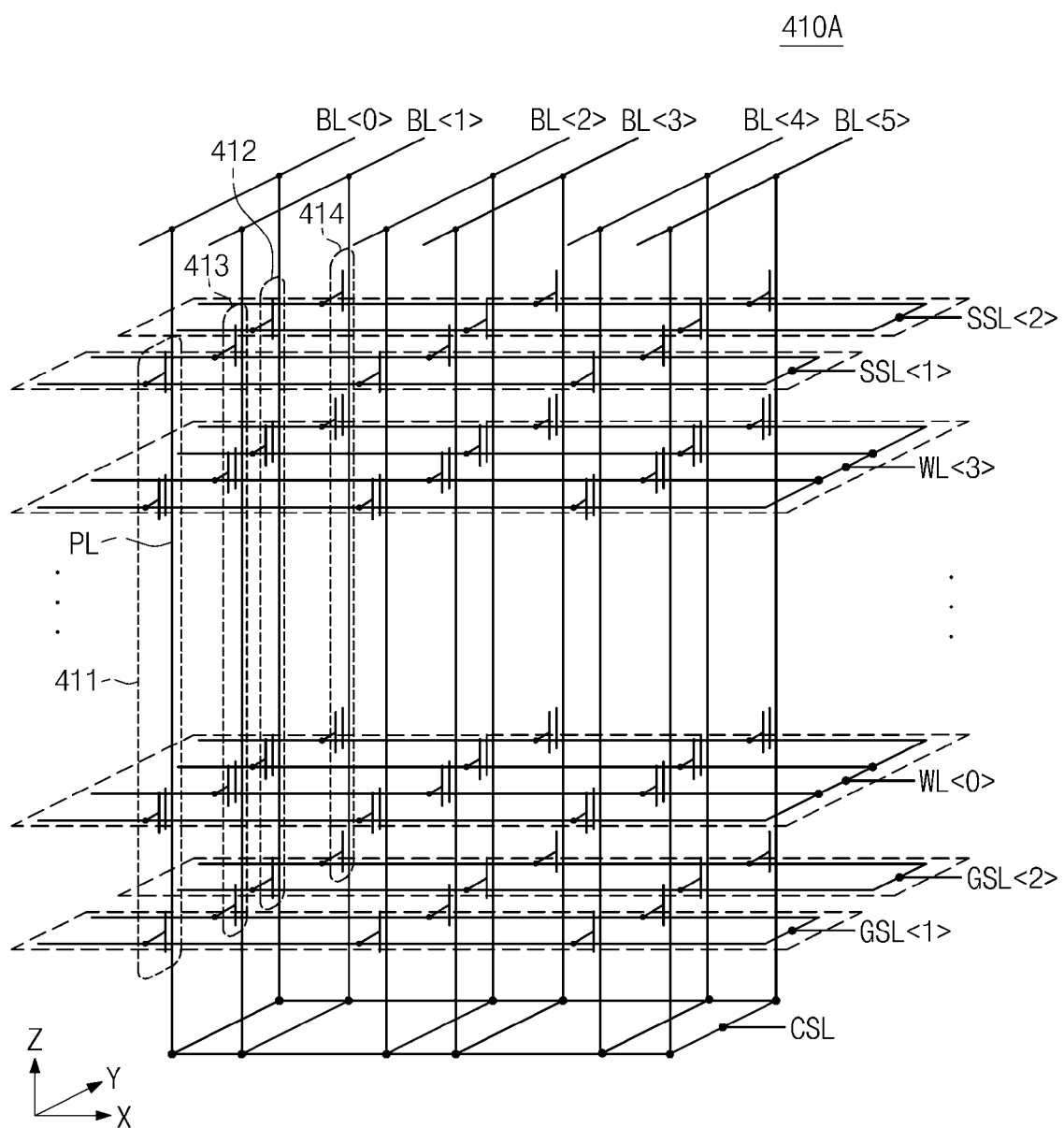

FIG. 9B illustrates a circuit diagram of the three-dimensional semiconductor memory device 410A illustrated in FIG. 9A. Referring to FIG. 9B, the three-dimensional semiconductor memory device 410A includes a plurality of bitlines BL<0>~BL<5> arranged thereabove in the Y-axis direction. A common source line CSL is formed on an underlying XY plane. A plurality of cell string CSTR are formed between the bitlines BL<0>~BL<5> and the common source line CSL in the Z-axis direction.

Two cell strings 411 and 412 may be connected to the bitline BL<0>. The cell string 411 is selected by a string selection line SSL<1> and a ground selection line GSL<1>, and the cell string 412 is selected by a string selection line SSL<2> and a ground selection line GSL<2>.

Two cell strings 413 and 414 may be connected to the bitline BL<1>. The cell string 413 is connected by the string selection line SSL<1> and the ground selection line GSL<1>, and the cell string 414 is selected by the string selection line SSL<2> and the ground selection line GSL<2>. That is, each of the bitlines includes one cell string selected by the selection lines SSL<1> and GSL<1> and one cell string selected by the selection lines SSL<2> and GSL<2>.

The above-described string structure may be equivalently applied to the other bitlines BL<2>~BL<5>. That is, a selective precharge operation of an inhibit string connected to a program bitline may be performed through ground selection lines GSL<1> and GSL<2> which are different from each other.

Figure 10:
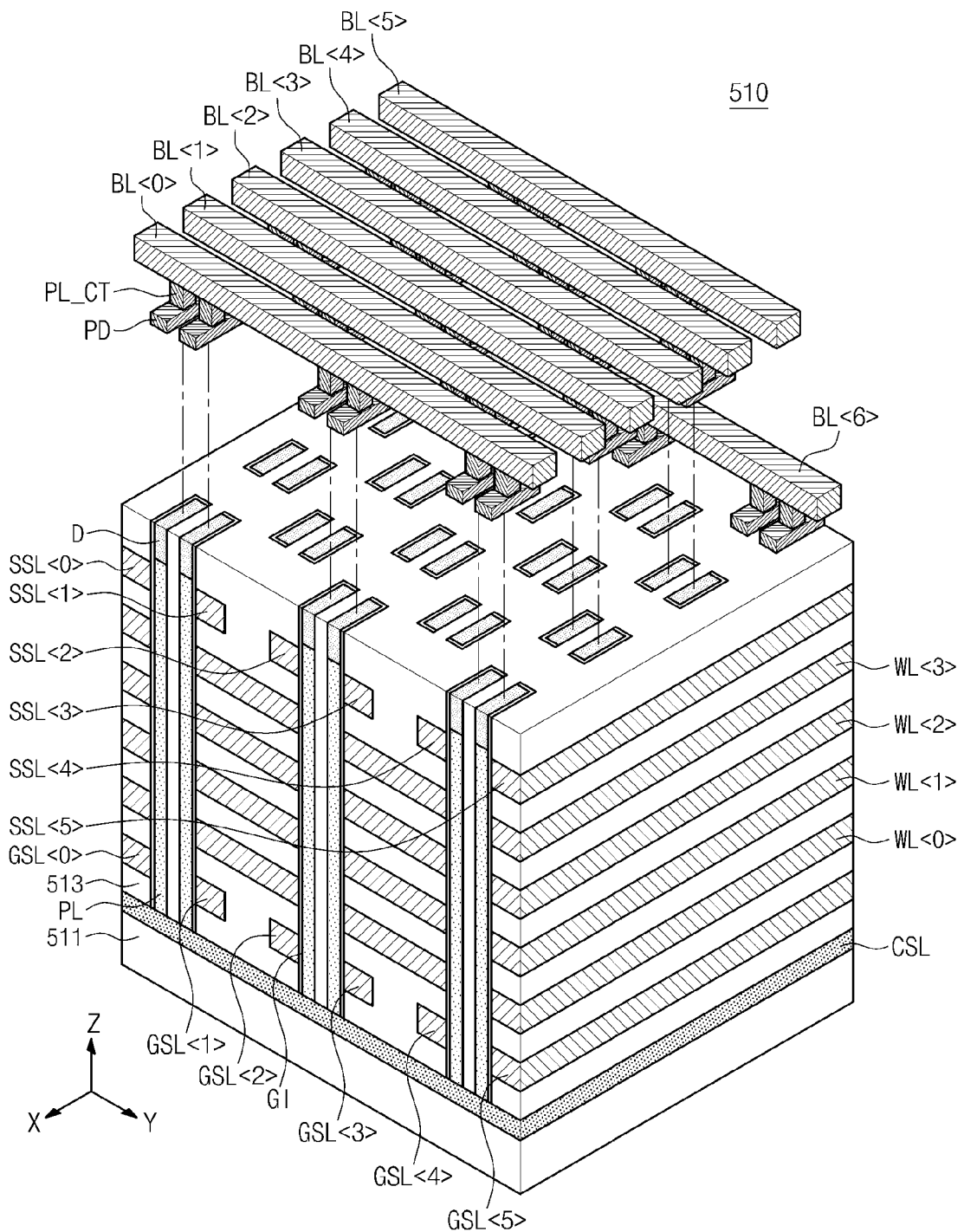
FIGS. 10 and 11 are perspective view illustrating exemplary embodiments of three-dimensional semiconductor memory devices with the programming method according to the present general inventive concept.

FIG. 10 is a perspective view illustrating another example of a three-dimensional semiconductor memory device 510 employing the programming method according to an exemplary embodiment of the present general inventive concept. The three-dimensional semiconductor memory device 510 may include six string selection lines SSL<0>~SSL<5> disposed above a substrate 511 of the three-dimensional memory device 510. The three-dimensional semiconductor memory device 510 may also include one or more cell strings, such as cell string 513, which may be similar to the cell strings 411, 412, 413, and 414 illustrated in FIG. 9B and described above. Further, the three-dimensional semiconductor memory device 510 may include six ground selection lines GSL<0>~GSL<5> disposed below the string selection lines SSL<0>~SSL<5>. While six string selection lines SSL<0>~SSL<5> and six ground selection lines GSL<0>~GSL<5> are illustrated in this figure, the number of the string selection lines and the number of the ground selection lines are not limited thereto and may be each larger than six.

The ground selection lines SSL<0>~SSL<5> may have the same width as the GSL<0>~GSL<5>. A pair of the string selection line SSL<1> and the ground selection line GSL<1> may control the same active pillars that are perpendicularly aligned. A string selection line SSL and a ground selection line GSL may be perpendicularly aligned and control the same active pillars.

FIG. 10 illustrates the three-dimensional memory device 510 including a plurality of ground selection lines GSL<1>~GSL<5> which are electrically insulated from each other. Thus, a precharge voltage Vpre provided to a common source line CSL may be selectively applied to inhibit strings.

Figure 11:
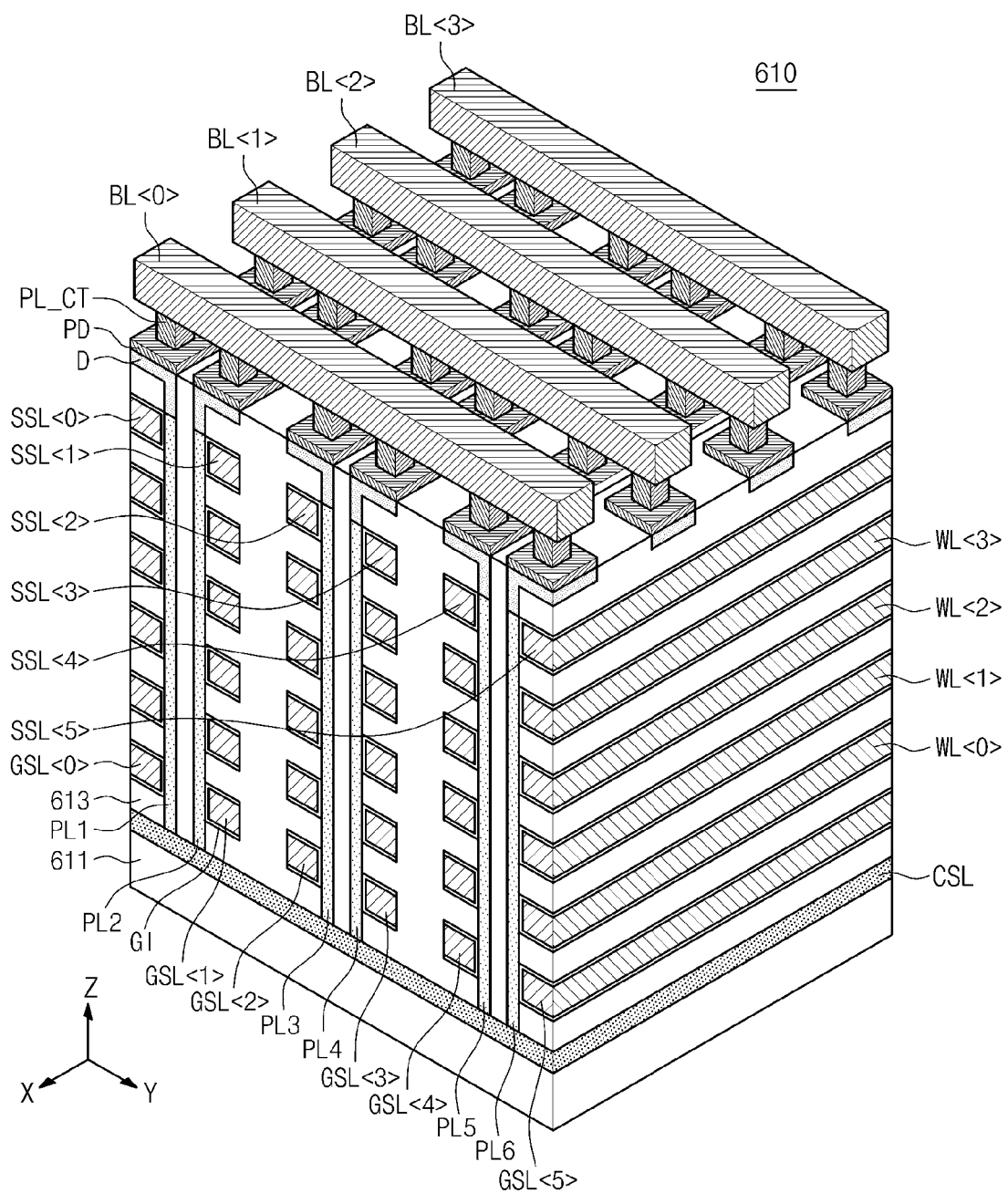

FIG. 11 is a perspective view illustrating a three-dimensional semiconductor memory device 610 employing the programming method according to exemplary embodiments of the present general inventive concept. The three-dimensional memory device 610 may include a substrate 611, one or more cell strings (e.g., including cell string 613, which is similar to cell strings 411, 412, 413, and 414 illustrated in FIG. 9B and described above), a plurality of control gates, and a plurality of active pillar pairs PLS. Active pillar pairs may, for example, include first active pillar PL1 and second active pillar PL2, third active pillar PL3 and fourth active pillar PL4, and fifth active pillar PL5 and sixth active pillar PL6. Wordlines WL<0>~WL<3> include a plurality of wordlines WL<0>~WL<3> that are three-dimensionally stacked on the substrate 611 and electrically insulated from one another. While four wordlines WL<0>~WL<3> are illustrated, the number of the wordlines is not limited thereto and may be larger than four.

The active pillar pairs PLS may include first active pillars PL1 and second active pillars PL2, which face each other. Each of the first and second active pillars PL1 and PL2 may be repeated in the X-axis direction. For example, third active pillars PL3 and fourth active pillars PL4 constituting active pillar pairs PLS and facing each other may be arranged in the X-axis direction, respectively. Similarly, fifth active pillars PL5 and sixth active pillars PL6 constituting active pillar pairs PLS and facing each other may be arranged in the X-axis direction, respectively. While the active pillars PL1, PL2, PL3, PL4, PL5, and PL6 are illustrated in this figure, the number of the active pillars is not limited thereto and the number may be greater than six.

Each of the active pillars PL1, PL2, PL3, PL4, PL5, and PL6 may have a major axis extending upwardly from the substrate 611 to the bitlines BL<0> to BL<3>. The active pillars PL1, PL2, . . . , and PL6 and the substrate 611 may be a semiconductor having a continuous structure. Each of the active pillars PL1, PL2, . . . , and PL6 may be single-crystalline. Alternatively, the active pillars PL1, PL2, . . . , and PL6 and the substrate 611 may be a polycrystalline or amorphous semiconductor having a discontinuous boundary surface. Each of the active pillars PL1, PL2, . . . , PL6 may include a body adjacent to the substrate 611 and a drain region D. The body may have the same conductivity type as the substrate 611, while the drain region D may be a different conductivity type from the substrate 611. Accordingly, the body and the drain region D may constitute a diode. An insulating layer may be disposed between active pillars facing each other and constituting active pillar pairs PLS.

String selection lines SSL<0>~SSL<6> may be provided between the bitlines BL<0>~BL<3> and an adjacent wordline to cross bitlines BL. The string selection lines SSL<0>~SSL<6> are isolated lines and may extend in the X-axis direction. Side surfaces of the string selection lines SSL<0>~SSL<6> may be provided to face sidewalls of the active pillars PL1, PL2, . . . , PL6. String selection lines SSL<0> and SSL<1> may be formed at opposite sides of pairs of the first active pillars PL1 and the second active pillars PL2. String selection lines SSL<2> and SS<3> may be formed at opposite sides of pairs of the third active pillar PL3 and the fourth active pillars PL4. String selection lines SSL<4> and SSL<5> may be formed at opposite sides of pairs of the fifth active pillars PL5 and the sixth active pillars PL6. The string selection lines SSL<0>~SSL<6> may control electrical connection between the active pillars PL1, PL2, . . . , and PL6 and the bitlines BL<0>~BL<3>. Accordingly, one active pillar may be independently selected by one bitline and one string selection line.

Further, ground selection lines GSL<0>~GSL<5> may be formed between the substrate 611 and an adjacent wordline WL<3> to control the electrical connection between the active pillars PL1, PL2, . . . , PL6 and the substrate 611. Both side surfaces of the ground selection lines may be formed to face the sidewalls of the active pillars PL1, PL2, . . . , PL6. The ground selection lines GSL<0>~GSL<5>, the wordlines WL<0>~WL<3>, and the string selection lines SSL<0>~SSL<6> may be perpendicularly aligned. The above three-dimensional semiconductor memory device 610 may be a NAND flash memory device where memory cells formed at one pillar cell constitute one cell string.

FIG. 11 illustrates the three-dimensional memory device 610 including a plurality of ground selection lines GSL<1>~GSL<5> which are electrically insulated from each other. When wordlines included in one layer are controlled by one wordline voltage, the programming method according to exemplary embodiments of the present general inventive concept may be effectively applied to the three-dimensional semiconductor memory device 610. In this case, a precharge voltage Vpre provided to a common source line CSL may be selectively applied to inhibit strings.

Figure 12:
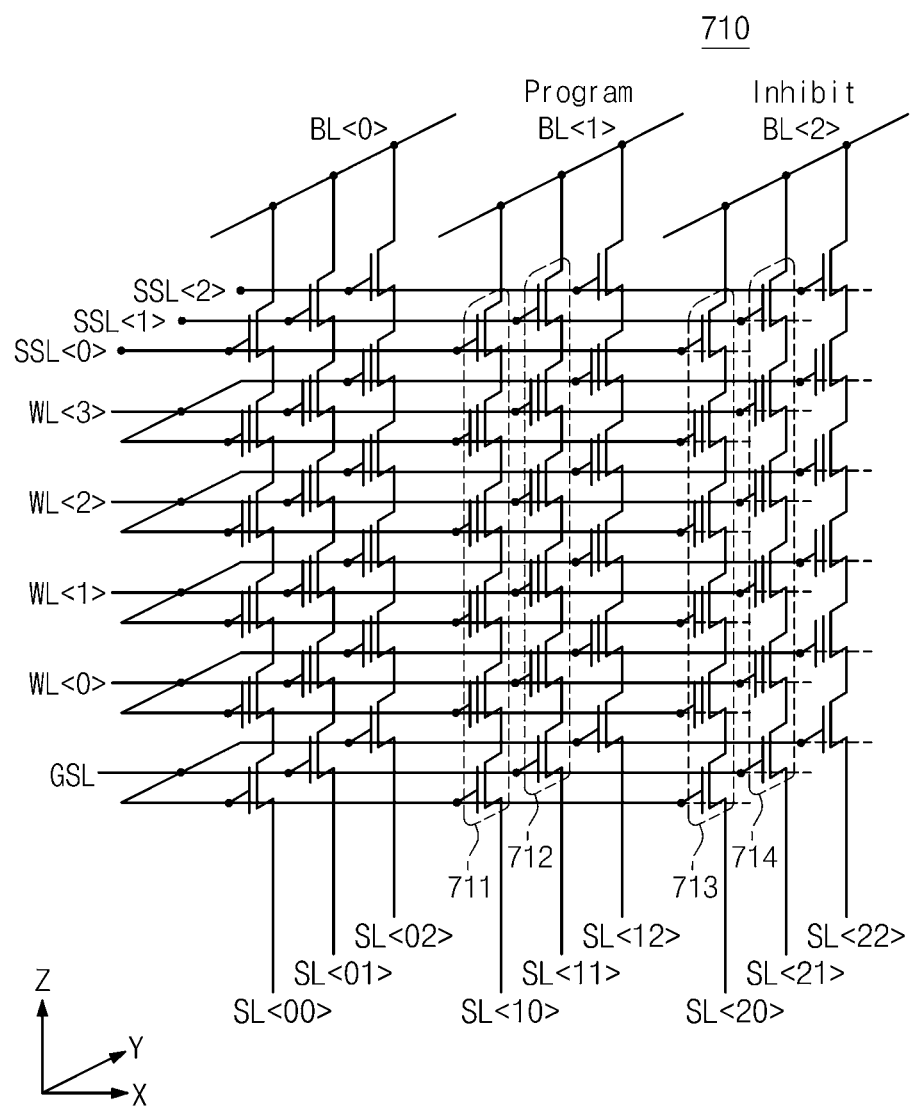
FIG. 12 is a circuit diagram illustrating a structure of a three-dimensional semiconductor memory device according to exemplary embodiments of the present general inventive concept.

FIG. 12 is a circuit diagram illustrating a three-dimensional memory device 710 of the present general inventive concept. Referring to FIG. 12, a ground selection line GSL is connected to gates of all ground selection transistors GST included in one layer. However, cell strings (e.g., cell strings illustrated in FIG. 12 that are similar to cell strings 412, 413, and 414 illustrated in FIG. 9B) may be connected to source lines SL<00>, SL<01>, SL<02>, SL<10>, SL<11>, SL<12>, SL<20>, SL<21>, and SL<22> for individually providing a source, respectively. Therefore, channels of the respective cell strings may be independently precharged by the source lines SL<00>, SL<01>, SL<02>, SL<10>, SL<11>, SL<12>, SL<20>, SL<21>, and SL<22>.

Cell strings connected to a program bitline BL<1> may include a program string 711 and an inhibit string 712. Cell strings connected to an inhibit bitline BL<2> may include inhibit strings 713 and 714.

A ground selection line GSL is activated during a program operation. Therefore, a ground selection transistor GST of all cell strings is turned on. However, a voltage of 0 volts is provided to the source line SL<10> of the program string and a precharge voltage Vpre is provided to the source lines SL<11>, SL<20>, and SL<21> of the inhibit strings 712, 713, 714. A channel of the inhibit string 712 connected to the program bitline BL<1> may be precharged through the above source lines (e.g., source lines SL<11>, SL<20>, and SL<21>). Thus, program disturbance may be reduced, and reliability of programmed data may be increased.

Figure 13:
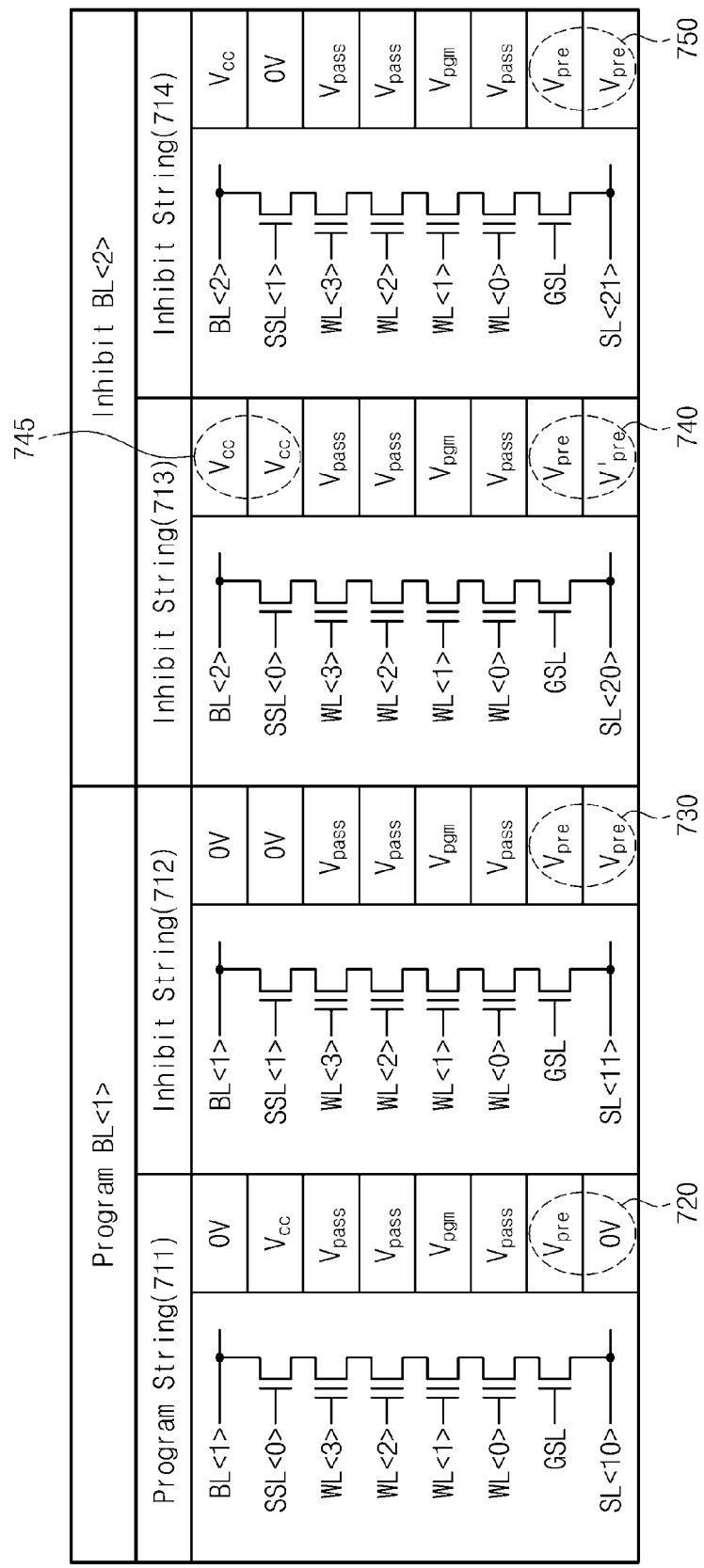
FIG. 13 is a table illustrating bias conditions of the three-dimensional semiconductor memory device illustrated in FIG. 12.

FIG. 13 is a table illustrating a bias condition applied to the circuit diagram illustrated in FIG. 12. During a program operation, a voltage of 0 volts is applied to the program bitline BL<1> and a power supply voltage Vcc is applied to the inhibit bitline BL<2>. The program bitline BL<1> includes the program string 711 and the inhibit string 712 which is inhibited from programming. A precharge voltage Vpre is equivalently provided to the ground selection line GSL of all cell strings.

The bias condition of the program string connected to the program bitline BL<1> is illustrated in the table of FIG. 13. That is, a voltage of 0 volts is applied to a bitline BL<1>, and a power supply voltage Vcc is applied to a string selection line SSL<0>. A program voltage Vpgm is applied to a selected wordline WL<1>, a pass voltage Vpass is applied to unselected wordlines WL<0>, WL<1>, and WL<3>. During a program operation, the voltage of 0 volts may be applied to a source line SL<10>. Under the above condition, a selected memory cell is programmed by FN tunneling. The bias condition of the ground selection line GSL and the source line SL<10> connected to the program bitline BL<1> is represented as a reference numeral 720.

The bias condition of the inhibit string 712 connected to the program bitline BL<1> is now described. A voltage of 0 volts is applied to a bitline BL<1>, and a voltage of 0 volts is applied to a string selection line SSL<1> to block selection of an inhibit string 712. Under this condition, a channel of the inhibit string 712 may not be precharged through the bitline BL<1>. Therefore, the channel of the inhibit string 712 may be charged using a voltage provided to a source line SL<11>. The bias condition of the ground selection line GSL and the source line SL<11> of the inhibit string 712 connected to the program bitline BL<1> is represented as a reference numeral 730.

Cell strings connected to an inhibit bitline BL<2> provided with a power supply voltage Vcc are all inhibit strings. However, a channel of an inhibit string 713 sharing a string selection line SSL<0> with the program string 711 may be precharged by the bitline BL<2>. Moreover, a channel of an inhibit string 713 may be precharged to a precharge voltage provided from a source line SL<20>. The channel of the inhibit string 713 may be precharged by the bitline BL<2> and the source line SL<20>. According to the levels of the precharge voltage Vpre and the power supply voltage Vcc, shut-off speeds of the string selection line SSL and the ground selection GSL may be equal to each other or different from each other. Nonetheless, a channel voltage of the inhibit string 713 may be charged to a target level. The bias conditions for precharging the inhibit string 713 connected to the inhibit bitline BL<2> are represented as reference numerals 740 and 745.

An inhibit string 714 connected to the inhibit bitline BL<2> shares a string selection line SSL<1> with the inhibit bitline 712. Therefore, a voltage of 0 volts is applied to the string selection line SSL<1> to block selection of the inhibit string 712 during the program operation. Under this condition, even when the power supply voltage Vcc is applied to the inhibit bitline BL<2>, a channel of the inhibit string 714 may not receive the precharge voltage Vpre from the bitline BL<2>. Similar to the inhibit string 712, the channel of the inhibit string 714 may be precharged through the common source line CSL. The bias condition of the ground selection line GSL and a source line SL<21> of the inhibit string 714 connected to the inhibit bitline BL<2> is represented as a reference numeral 750.

Figure 14:
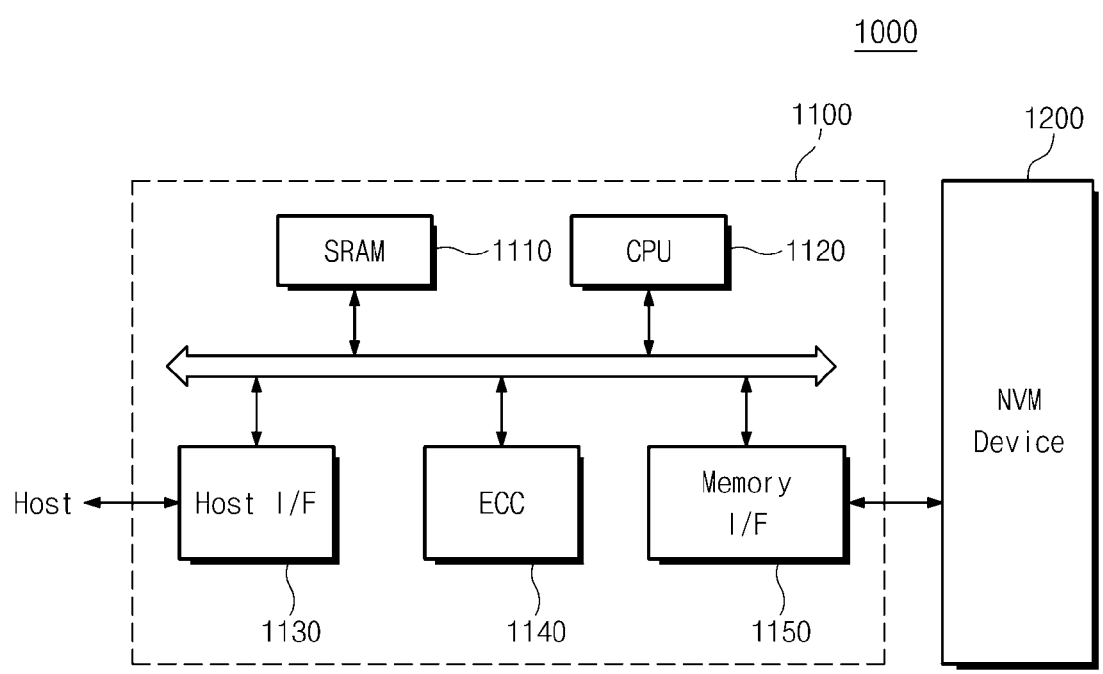
FIG. 14 is illustrates a memory system including a non-volatile memory device according to the present general inventive concept.

FIG. 14 illustrates a block diagram of a memory system 1000 including a nonvolatile memory device 1200 performing a program operation according to exemplary embodiments of the present general inventive concept. Referring to FIG. 14, the memory system 1000 may include nonvolatile memory device 1200 and a memory controller 1100. The nonvolatile memory device 1200 may be substantially identical to a nonvolatile memory device described with reference to FIG. 1 and will not be described in further detail. The memory controller 1100 may control the nonvolatile memory device 1200. The nonvolatile memory device 1200 and the memory controller 1100 are combined into a memory card or a solid-state disk (SSD).

An SRAM 1110 (static random access memory) may be an operation memory of a processing unit 1120. A host interface 1130 may include a data exchange protocol of a host connected to the memory system 1000. An error correction code block (ECC) 1140 detects and corrects an error included in data read out of the three-dimensional nonvolatile memory device 1200. A memory interface 1150 may interface with the flash memory device 1200. The processing unit 1120 may control data exchange operations of the memory controller 1100. Although not illustrated in the figure, it will be understood by a person of ordinary skill in the art that the memory system 1000 is provided with a ROM (not illustrated) configured to store code data to interface with the host when executed. The nonvolatile memory device 1200 may be a multi-chip package including a plurality of flash memory chips.

According to the above-described memory system 1000, a program disturbance arising from high integration may be reduced. Therefore, the above-described memory system 1000 may be a storage medium having increased capacity and reliability. Especially, recently issued memory systems such as SSD may include a flash memory device according to the present general inventive concept. In this case, the memory controller 1100 may be configured to communicate with an exterior device (e.g., host) through one of various interface protocols such as USB, MMC, PCI-E, SATA, PATA, SCSI, ESDI, and IDE.

The nonvolatile memory device 1200 is a nonvolatile memory device to retain its stored data even when its power supply is interrupted. With the increasing use of mobile devices such as cellular phones, personal data assistants (PDA), digital cameras, portable game consoles, and MP3 players, flash memory devices have been widely used as not only data storages but also code storages. Flash memory devices may be used in home applications such as high-definition television sets (HDTV), digital video disks (DVD), routers, and global positional systems (GPS).

In exemplary embodiments of the present general inventive concept, the memory controller 1100 and the nonvolatile memory device 1200 may be integrated into one semiconductor device. The memory controller 1100 and the nonvolatile memory device 1200 are integrated into one semiconductor device to constitute a memory card such as, for example, a personal computer memory card international association (PCMCIA) card, a compact flash card (CF), a smart media card (SM, SMC), a multimedia card (MMC, RS-MMC, MMCmicro), an SD card (SD, miniSD, microSD, SDHC), a universal flash memory device (UFS).

In exemplary embodiments of the present general inventive concept, the memory controller 1100 and the memory device 1200 are integrated into one semiconductor device to constitute a solid-state disk (SSD). For example, an SSD may include a storage device configured to store data in a semiconductor memory. In the case where the memory system 1000 is used as an SDD, reliability of data provided to a host connected to the memory system 1000 may be increased.

Furthermore, the memory system 1000 may be applied to computers, personal computers (PC), ultra mobile personal computers (UM PC), workstations, PDA, portable computers, smart phones, digital cameras, digital audio recorders, digital audio players, digital picture recorders, digital picture players, digital video recorders, digital video players, one of various electronic devices of a home network, one of various electronic devices of a telematics network, RFID devices or one component (e.g., an SSD, a memory card, etc.) among various components of a computing system.

Figure 15:
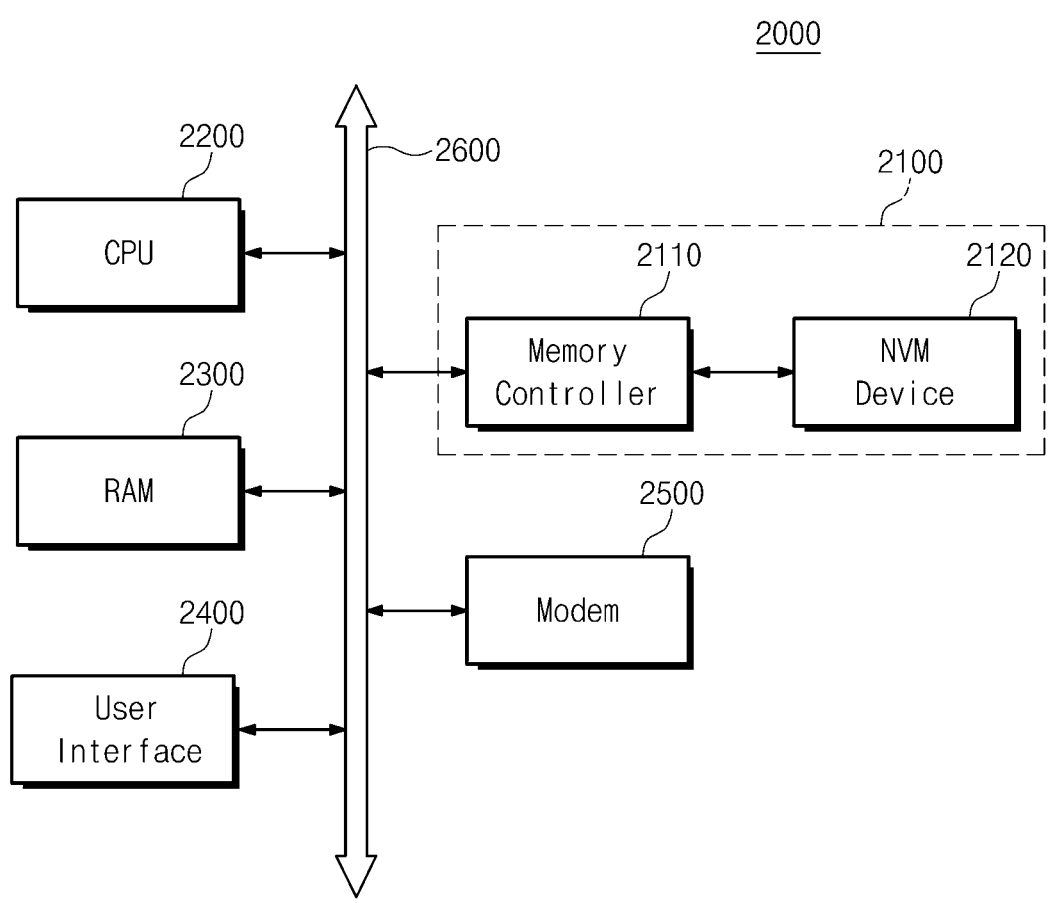
FIG. 15 illustrates a computing system including a non-volatile memory device according to the present general inventive concept.

FIG. 15 illustrates a computing system 2000 including a nonvolatile memory device 2120 according to exemplary embodiments of the present general inventive concept. The computing system 2000 includes a microprocessor 2200 electrically connected to a system bus 2600, a RAM 2300, a user interface 2400, a modem 2500 such as baseband chipset, and a memory system 2100. The memory system 2100 includes a memory controller 2100 and the nonvolatile memory device 2120. The nonvolatile memory device 2120 may have the same or a similar configuration as illustrated in FIG. 1. N-bit data (N being a positive integer) processed/to be processed by the microprocessor 2200 is stored in the three-dimensional nonvolatile memory device through the memory controller 2110. In the case where the computing system 2000 according to the present general inventive concept is a mobile device, a battery (not illustrated) may be additionally provided to supply an operation voltage of the computing system. Although not illustrated in this figure, it will be understood by a person of ordinary skill in the art that the computing system according to the present general inventive concept may be further provided with an application chipset, a camera image processor (CIS), a mobile DRAM and so forth. The memory controller 2110 and the nonvolatile memory device 2120 may constitute, for example, a solid-state disk/drive (SSD) that stores data using a nonvolatile memory device.

A nonvolatile memory device and/or a memory controller according to exemplary embodiments of the present general inventive concept may be mounted using one or more forms of packages. The nonvolatile memory device and/or the memory controller according to the present general inventive concept may be mounted using packages, for example, PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

According to exemplary embodiments of the present general inventive concept, a channel boosting efficiency of strings sharing a selected bitline for programming is increased. Thus, program interference is effectively suppressed to achieve a three-dimensional semiconductor memory device of high data reliability.

Although exemplary embodiments of the present general inventive concept have been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A method of pre-charging channels of a semiconductor memory device having a first cell group having a program string and a first inhibit string connected to a program bit line, a second cell group having a second inhibit string and a third inhibit string connected to an inhibit bit line, and a common source line connected to the program string and the first to third inhibit strings, the method comprising:
   pre-charging a channel of the third inhibit string that is not connected to the program string with a same selection line by applying a first voltage to the common source line; and
   boosting the pre-charged channel by providing a word line voltage to the strings, the program string being connected to the second inhibit string by a first string selection line and the first inhibit string being connected to the third inhibit string by a second string selection line, the program string being connected to the second inhibit string by a first ground selection line and the first inhibit string being connected to the third inhibit string by a second ground selection line, the program bit line being supplied with a voltage of 0 volt, the inhibit bit line being supplied with a power supply voltage, and a first string selection transistor of the first string selection line and a second ground selection transistor of the second ground selection line being turned on, while a second string selection transistor of the second string selection line and a first ground selection transistor of the first ground selection line are turned off.

2. A method of pre-charging channels of a semiconductor memory device having a first cell group having a program string and a first inhibit string connected to a program bit line, a second cell group having a second inhibit string and a third inhibit string connected to an inhibit bit line, and a common source line connected to the program string and the first to third inhibit strings, the method comprising:
   pre-charging a channel of the third inhibit string that is not connected to the program string with the same selection line by applying a first voltage to the common source line; and
   boosting the pre-charged channel by providing a word line voltage to the strings, the program string being connected to the second inhibit string by a first string selection line and the first inhibit string being connected to the third inhibit string by a second string selection line, the program string being connected to the second inhibit string by a first ground selection line and the first inhibit string being connected to the third inhibit string by a second ground selection line; and pre-charging a channel of the first inhibit string by applying the first voltage to the common source line, the program bit line being supplied with a voltage of 0 volt, the inhibit bit line being supplied with a power supply voltage a first string selection transistor of the first string selection line and a second ground selection transistor of the second ground selection line being turned on, while a second string selection transistor of the second string selection line and a first ground selection transistor of the first ground selection line are turned off.

3. A method of pre-charging channels of a semiconductor memory device having a first cell group having a program string and a first inhibit string connected to a program bit line, a second cell group having a second inhibit string and a third inhibit string connected to an inhibit bit line, and a common source line connected to the program string and the first to third inhibit strings, the method comprising:

pre-charging a channel of the third inhibit string that is not connected to the program string with a same selection line by applying a first voltage to the common source line; and boosting the pre-charged channel by providing a word line voltage to the strings, the program string being connected to the second inhibit string by a first string selection line and the first inhibit string being connected to the third inhibit string by a second string selection line, the program string being connected to the second inhibit string by a first ground selection line and the first inhibit string being connected to the third inhibit string by a second ground selection line; and pre-charging a channel of the second inhibit string by applying a second voltage to the inhibit bit line, the program bit line being supplied with a voltage of 0 volt, the inhibit bit line being supplied with a power supply voltage, and a first string selection transistor of the first string selection line and a second ground selection transistor of the second ground selection line being turned on, while a second string selection transistor of the second string selection line and a first ground selection transistor of the first ground selection line are turned off.

4. The method of claim 3, wherein the second voltage is equal to the power supply voltage.

5. A method of pre-charging channels of a semiconductor memory device having a first cell group having a program string and a first inhibit string connected to a program bit line, a second cell group having a second inhibit string and a third inhibit string connected to an inhibit bit line, and a common source line connected to the program string and the first to third inhibit strings, the method comprising:

pre-charging a channel of the first inhibit string by applying a first voltage to the common source line;

pre-charging a channel of the second inhibit string by applying a second voltage to the bit line; and boosting the pre-charged channels by providing a word line voltage to the strings, the program string being connected to the second inhibit string by a first string selection line and the first inhibit string being connected to the third inhibit string by a second string selection line, the program string being connected to the second inhibit string by a first ground selection line and the first inhibit string being connected to the third inhibit string by a second ground selection line, the program bit line being supplied with a voltage of 0 volt, the inhibit bit line being supplied with a power supply voltage, and a first string selection transistor of the first string selection line and a second ground selection transistor of the second ground selection line being turned on, while a second string selection transistor of the second string selection line and a first ground selection transistor of the first ground selection line are turned off.

6. The method of claim 5, wherein the second voltage is equal to the power supply voltage.

7. A method of pre-charging channels of a semiconductor memory device having a first cell group having a program string and a first inhibit string connected to a program bit line, a second cell group having a second inhibit string and a third inhibit string connected to an inhibit bit line, and a common source line connected to the program string and the first to third inhibit strings, the method comprising:

pre-charging a channel of the first inhibit string by applying a first voltage to the common source line;

pre-charging a channel of the second inhibit string by applying a second voltage to the bit line;

pre-charging a channel of the third inhibit string by applying the first voltage to the common source line;

boosting the pre-charged channels by providing a word line voltage to the strings;

supplying the program bit line with a voltage of 0 volt, supplying the inhibit bit line with a power supply voltage, and turning on a first string selection transistor of a first string selection line and a second ground selection transistor of a second ground selection line, while a second string selection transistor of a second string selection line and a first ground selection transistor of a first ground selection line are turned off;

pre-charging a channel of the first inhibit string by applying the first voltage to the common source line, supplying the program bit line with a voltage of 0 volt, supplying the inhibit bit line with a power supply voltage, and turning on a first string selection transistor of the first string selection line and a second ground selection transistor of the second ground selection line while a second string selection transistor of the second string selection line and a first ground selection transistor of the first ground selection line are turned off; and pre-charging a channel of the second inhibit string by applying a second voltage to the inhibit bit line, supplying the program bit line with a voltage of 0 volt, supplying the inhibit bit line with a power supply voltage, and turning on a first string selection transistor of the first string selection line and a second ground selection transistor of the second ground selection line while a second string selection transistor of the second string selection line and a first ground selection transistor of the first ground selection line are turned off.

* * * * *